United States Patent
Shin et al.

(10) Patent No.: US 12,428,581 B2
(45) Date of Patent: Sep. 30, 2025

(54) CHEMICAL MECHANICAL POLISHING SLURRY COMPOSITION FOR POLISHING BORON SILICON COMPOUND, CHEMICAL MECHANICAL POLISHING METHOD AND METHOD OF FABRICATING SEMICONDUCTOR DEVICE USING THE SAME

(71) Applicants: SK hynix Inc., Icheon (KR); IUCF-HYU (Industry-University Cooperation Foundation Hanyang University), Seoul (KR)

(72) Inventors: Cheolmin Shin, Seoul (KR); Hyun Goo Kang, Seoul (KR); Jong Young Cho, Hanam (KR); Ungyu Paik, Seoul (KR); Taeseup Song, Seoul (KR); Dong Hyeok Kim, Seoul (KR)

(73) Assignees: SK hynix Inc., Icheon (KR); IUCF-HYU (Industry-University Cooperation Foundation Hanyang University), Seoul (KR)

( * ) Notice: Subject to any disclaimer, the term of this patent is extended or adjusted under 35 U.S.C. 154(b) by 367 days.

(21) Appl. No.: 18/047,601

(22) Filed: Oct. 18, 2022

(65) Prior Publication Data
US 2023/0123263 A1 Apr. 20, 2023

(30) Foreign Application Priority Data
Oct. 19, 2021 (KR) .................. 10-2021-0139140

(51) Int. Cl.
*C09G 1/02* (2006.01)
*H01L 21/304* (2006.01)

(52) U.S. Cl.
CPC .............. *C09G 1/02* (2013.01); *H01L 21/304* (2013.01)

(58) Field of Classification Search
CPC ... C09G 1/02; H01L 21/304; H01L 21/31144; H01L 21/3212; H01L 21/30625; C09K 3/1436; C09K 3/1409; C09K 3/1454
See application file for complete search history.

(56) References Cited

U.S. PATENT DOCUMENTS

| | | | |
|---|---|---|---|
| 6,582,623 B1* | 6/2003 | Grumbine | C09G 1/02 252/79.3 |
| 7,052,373 B1* | 5/2006 | Yang | C09G 1/02 51/307 |

(Continued)

FOREIGN PATENT DOCUMENTS

| | | |
|---|---|---|
| JP | 201274734 A | 4/2012 |
| JP | 2020534679 A | 11/2020 |
| KR | 100583118 B1 | 5/2006 |

*Primary Examiner* — Joshua L Allen
*Assistant Examiner* — Christopher Remavege

(57) ABSTRACT

A CMP slurry composition for polishing a boron silicon (B—Si) compound may include a catalyst, an abrasive including a plurality of particles and being configured to polish the boron silicon (B—Si) compound, and a pH adjuster. The CMP slurry composition may further include an oxidizer. The catalyst may have a binary catalyst configuration comprising a first catalyst material and a second catalyst material. The first catalyst material may include Fe, and the second catalyst material may include Cu. The oxidizer may include hydrogen peroxide ($H_2O_2$). A CMP (chemical mechanical polishing) method for a boron silicon (B—Si) compound may include providing a substrate structure including a thin film formed of the boron silicon (B—Si) compound and performing a CMP process on the thin film. The CMP process is performed by using the CMP slurry composition.

15 Claims, 16 Drawing Sheets

(56) References Cited

U.S. PATENT DOCUMENTS

| | | | |
|---|---|---|---|
| 2003/0077985 A1* | 4/2003 | Zhou | C09G 1/02 |
| | | | 451/41 |
| 2004/0192172 A1* | 9/2004 | Towery | C09K 3/1436 |
| | | | 51/307 |
| 2006/0141770 A1* | 6/2006 | Ryu | H01L 21/7684 |
| | | | 257/E21.583 |
| 2021/0017421 A1* | 1/2021 | Ward | C23F 3/06 |
| 2021/0230451 A1* | 7/2021 | Kim | C09G 1/02 |
| 2022/0235247 A1* | 7/2022 | Johnson | C09G 1/02 |
| 2022/0363948 A1* | 11/2022 | Hong | C09D 5/00 |

\* cited by examiner

CHEMICAL MECHANICAL POLISHING SLURRY COMPOSITION FOR POLISHING BORON SILICON COMPOUND, CHEMICAL MECHANICAL POLISHING METHOD AND METHOD OF FABRICATING SEMICONDUCTOR DEVICE USING THE SAME

CROSS-REFERENCE TO RELATED APPLICATION

The present application claims, under 35 U.S.C. § 119(a), the benefit of Korean application No. 10-2021-0139140, filed on Oct. 19, 2021, which is herein incorporated by reference in its entirety.

BACKGROUND

1. Field

Embodiments of the present disclosure relates to a CMP slurry composition and a device manufacturing method using the same, and more particularly, to a CMP slurry composition for polishing boron silicon compound, a CMP method using the same, and a semiconductor device manufacturing method using the same.

2. Description of the Related Art

In general, patterns constituting a semiconductor device may be formed by sequentially forming an etching target layer and a hard mask pattern on a predetermined underlying layer, and then etching the etching target layer exposed between patterns of the hard mask pattern. As such, when an etching process is performed by using the hard mask pattern serving as the etching mask, it may be desirable to keep the hard mask pattern substantially the same while the etching target layer exposed between the hard mask pattern is etched.

However, as a degree of integration of the semiconductor device increases and a line width/scale of the pattern continuously decreases, an aspect ratio of the region to be etched in the etching target layer increases, thereby causing the hard mask pattern to be significantly removed during the etching process. This may be based upon the following reason. That is, as a ratio of the thickness to be etched to the width to be etched (i.e., the aspect ratio) increases, the hard mask pattern formed relatively thin compared to the thickness of the etching target layer may be lost during the etching process.

In order to solve this problem, it may be considered to make the thickness of the hard mask pattern thicker, but in this case, the aspect ratio of the hard mask pattern also increases. The hard mask pattern having the increased aspect ratio has a problem that it is difficult to stably perform the etching process of the hard mask layer for forming the hard mask pattern, similar to the process of etching the etching target layer. Therefore, development of a hard mask material capable of stably performing an etching process without increasing the thickness is required, and in this regard, the possibility of using a boron silicon compound thin film is raised. However, when the boron silicon compound thin film is applied as a hard mask material, it may be difficult to remove the hard mask pattern by chemical mechanical polishing (CMP) in a subsequent process after a device patterning process. When the conventional CMP slurry is applied to the boron silicon compound thin film, the polishing removal rate may be low.

SUMMARY

An object of embodiments of the present disclosure is to provide a CMP slurry composition for polishing a boron silicon (B—Si) compound capable of chemically and mechanically polishing a boron silicon (B—Si) compound thin film with ease.

In addition, a technical problem to be achieved by embodiments of the present disclosure is to provide a CMP method using the CMP slurry composition for polishing a boron silicon (B—Si) compound.

In addition, a technical problem to be achieved by embodiments of the present disclosure is to provide a method for manufacturing a semiconductor device (electronic device) to which the CMP slurry composition for polishing a boron silicon (B—Si) compound is applied.

Embodiments of the present disclosure may not be limited to address the above-mentioned issues.

According to an embodiment of the present disclosure, there is provided a CMP (chemical mechanical polishing) slurry composition for polishing a boron silicon (B—Si) compound, the CMP slurry composition comprising: a catalyst; an abrasive; and a pH adjuster.

The CMP slurry composition may further include an oxidizer.

The oxidizer may include any one selected from the group consisting of hydrogen peroxide ($H_2O_2$), periodic acid, periodate salt, perbromic acid, perbromate salt, perchloric acid, perborate salt, and permanganate.

The catalyst may include any one selected from the group consisting of Fe, Cu, Ce, Cr, Co, Mn, Mo, Ru, Ti, and V.

The catalyst may have a binary catalyst configuration comprising a first catalyst material and a second catalyst material, the first v material may include Fe, and the second catalyst material may include Cu.

The first catalyst material may be $Fe(NO_3)_3$ and the second catalyst material may be $Cu(NO_3)_2$.

A concentration of the first catalyst material may be about 0.05 to 5.0 mM, and a concentration of the second catalyst material may be about 0.05 to 5.0 mM.

A content of the oxidizer may be about 0.5 to 5.0 wt %, and a content of the abrasive may be about 0.1 to 5.0 wt %.

The oxidizer may include hydrogen peroxide ($H_2O_2$), and the abrasive may include any one selected from the group consisting of silica, alumina, ceria, titania, zirconia, and germania.

The abrasive may include metal oxide particles, and the surface of the metal oxide particles may be modified with amine functionalized silane.

The surface of the metal oxide particles may be modified with any one of APTES, DAPTMS, and TAPTMS.

The metal oxide particles may be silica particles.

The CMP slurry composition may have a pH of about 2.5 to 3.5.

A content of boron in the boron silicon (B—Si) compound may be about 55 to 75 mole %.

According to another embodiment of the present disclosure, there is a CMP (chemical mechanical polishing) method for a boron silicon (B—Si) compound, the method comprising: providing a substrate structure including a thin film formed of a boron silicon (B—Si) compound; and performing a CMP process on the thin film, wherein the CMP process is performed by using the above-described CMP slurry composition for polishing a boron silicon (B—Si) compound.

According to another embodiment of the present disclosure, there is provided a method of manufacturing a semiconductor device, the method comprising: forming a mold layer on an underlying layer; forming a hard mask layer including a boron silicon (B—Si) compound on the mold layer; forming a photoresist pattern on the hard mask layer; forming a hard mask pattern by patterning the hard mask layer by using the photoresist pattern as an etch mask; forming a plurality of holes exposing the underlying layer by etching the mold layer by using the hard mask pattern as an etch mask; forming a storage node in the plurality of holes; and removing the hard mask pattern by a CMP process, wherein the removing the hard mask pattern by the CMP process is performed by using the above-described CMP slurry composition for polishing a boron silicon (B—Si) compound.

According to embodiments of the present disclosure, a CMP slurry composition for polishing a boron silicon (B—Si) compound capable of chemically and mechanically polishing a boron silicon (B—Si) compound thin film with ease may be implemented. When the CMP slurry composition for polishing a boron silicon (B—Si) compound according to the above embodiments is used, a boron silicon (B—Si) compound may be easily polished (removed) by the CMP method in a manufacturing process of a semiconductor device (electronic device) such as forming a storage node of a DRAM. Accordingly, it is possible to easily manufacture a high-integration/high-performance semiconductor device to which a boron silicon (B—Si) compound is applied.

DETAILED DESCRIPTION

Figure 1:
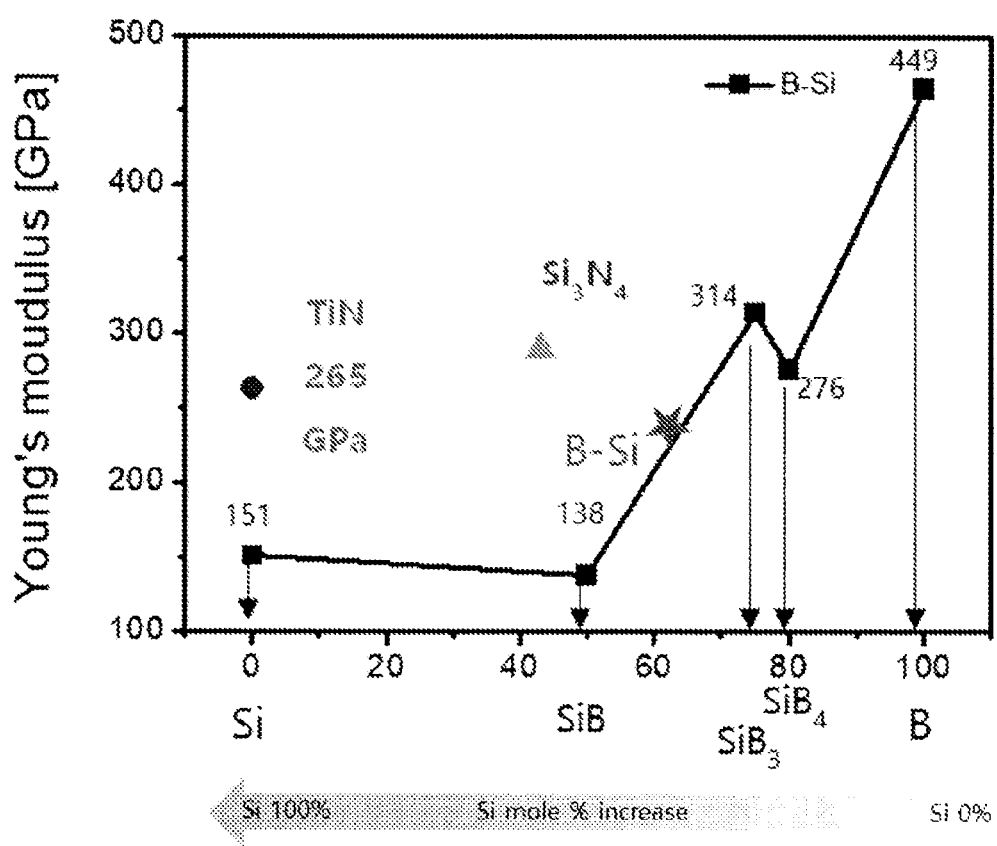
FIG. 1 is a graph for explaining physical properties of a boron silicon (B—Si) compound which is a polishing target of a CMP (chemical mechanical polishing) slurry composition according to an embodiment of the present disclosure.

Hereinafter, embodiments of the present disclosure will be described in detail with reference to the accompanying drawings.

These embodiments of the present disclosure to be described below are provided to more clearly explain various embodiments of the present disclosure to those having common knowledge in the related art, and the scope of embodiments of the present disclosure is not limited by the following embodiments. The following embodiments may be modified in many different forms.

The terminology used herein is used to describe specific embodiments, and is not used to limit embodiments of the present disclosure. As used herein, terms in the singular form may include the plural form unless the context clearly dictates otherwise. Also, as used herein, the terms "comprise" and/or "comprising" specifies presence of the stated shape, step, number, action, member, element and/or group thereof; and does not exclude presence or addition of one or more other shapes, steps, numbers, actions, members, elements, and/or groups thereof. In addition, the term "connection" as used herein is a concept that includes not only that certain members are directly connected, but also a concept that other members are further interposed between the members to be indirectly connected.

In addition, in the present specification, when a member is said to be located "on" another member, this includes not only a case in which a member is in contact with another member but also a case in which another member is present between the two members. As used herein, the term "and/or" includes any one and any combination of one or more of those listed items. In addition, as used herein, terms such as "about," "substantially," etc. are used as a range of the numerical value or degree, in consideration of inherent manufacturing and material tolerances, or as a meaning close to the range. Furthermore, accurate or absolute numbers provided to aid the understanding of the present application are used to prevent an infringer from using the disclosed technology unfairly.

Hereinafter, embodiments of the present disclosure will be described in detail with reference to the accompanying drawings. The size or the thickness of the regions or the parts illustrated in the accompanying drawings may be slightly exaggerated for clarity and convenience of description. The same reference numerals refer to the same elements throughout the detailed description.

FIG. 1 is a graph for explaining physical properties of a boron silicon (B—Si) compound which is a polishing target of a CMP (chemical mechanical polishing) slurry composition according to an embodiment of the present disclosure.

Referring to FIG. 1, as a content (e.g., mole %) of boron in the boron silicon (B—Si) compound increases, the Young's modulus value may significantly increase. This indicates that the mechanical hardness of the boron silicon (B—Si) compound significantly increases with the content of boron.

The content of boron in the boron silicon (B—Si) compound which is a polishing target of the CMP slurry composition according to an embodiment of the present disclosure may be about 55 to 75 mole % or about 60 to 70 mole %. The boron silicon (B—Si) compound is different from 'boron-doped silicon' and may be a compound in which a boron atom and a silicon atom are chemically bonded. The boron silicon (B—Si) compound may be referred to as a kind of "boron silicon (B—Si) alloy." Since both of boron and silicon are metalloids, it may be seen that a quasi-alloy is formed by chemical bonding between them. In addition, the boron silicon (B—Si) compound may be a kind of boron silicide.

As described above, the boron silicon (B—Si) compound has potential to be applied as a new hard mask material when manufacturing a semiconductor device. For example, when forming a storage node of a dynamic random access memory (DRAM), there is a possibility that a boron silicon (B—Si) compound is applied as a hard mask material. As a line width of the next-generation DRAM decreases, an aspect ratio of a region to be etched in an etching target layer increases, and it may be difficult to cope with the problem caused by the increase in the aspect ratio with the existing poly-Si-based hard mask material. That is, in the case of a hard mask material such as poly-Si, it may be difficult to address decrease in etching selectivity according to increase in the aspect ratio, increase in the thickness of the hard mask, a hard mask bowing phenomenon, and the like. Accordingly, attempts have been made to change the hard mask material from polysilicon (poly-Si) to the boron silicon (B—Si) compound.

However, since the boron silicon (B—Si) compound has a high mechanical strength and an excellent chemical stability compared to a polysilicon (poly-Si), it may be difficult to remove the boron silicon (B—Si) compound by polishing with a conventional CMP slurry composition. The above-described chemical stability may be due to the chemical stability of B—Si bonding (interatomic bonding) and B—B bonding (interatomic bonding), which is a chemical inertness.

The following table 1 shows the measuring results of Young's modulus (GPa) and hardness (GPa) for polysilicon (poly-Si) and boron silicon (B—Si) compound. Here, the Young's modulus and hardness are measured by a nanoindentation method.

TABLE 1

|  | Hardness [GPa] | Young's modulus [GPa] |
| --- | --- | --- |
| Poly-Si | 19.4 | 239 |
| B—Si | 28.2 | 263 |

Referring to Table 1, Young's modulus and hardness of the boron silicon (B—Si) compound may be significantly higher than those of polysilicon (poly-Si). For example, hardness of the boron silicon (B—Si) compound may be about 1.5 times as great as that of polysilicon (poly-Si). As such, the boron silicon (B—Si) compound may have stronger mechanical properties than that of polysilicon (poly-Si). In addition, as mentioned above, the boron silicon (B—Si) compound may have high chemical stability compared to polysilicon (poly-Si). Therefore, it may be difficult to mechanically and chemically polish the boron silicon (B—Si) compound with ease by using a conventional CMP slurry composition. Developing a CMP slurry composition suitable for polishing the boron silicon (B—Si) compound may be desirable.

Figure 2:
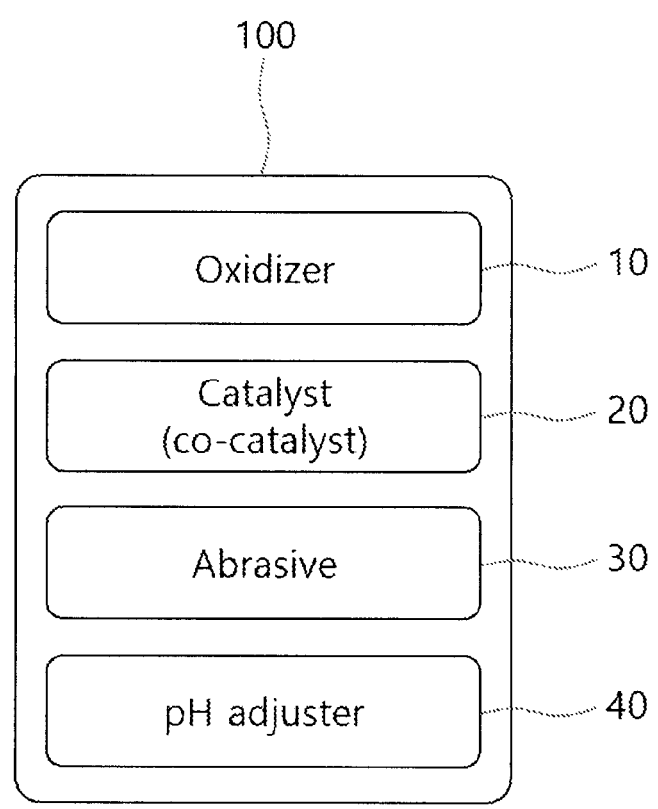
FIG. 2 is a diagram for explaining a configuration of a CMP slurry composition for polishing a boron silicon (B—Si) compound according to an embodiment of the present disclosure.

FIG. 2 is a diagram for explaining a configuration of a CMP slurry composition 100 for polishing a boron silicon (B—Si) compound according to an embodiment of the present disclosure.

Referring to FIG. 2, the CMP slurry composition 100 for polishing a boron silicon (B—Si) compound according to an embodiment of the present disclosure may include an oxidizer 10, a catalyst 20, and an abrasive 30, and a pH adjuster 40.

The oxidizer 10 may serve to make an oxide film by oxidizing a surface of the boron silicon (B—Si) compound, for example, a boron silicon compound having a film form, and as a result, it may play a role to increase the polishing rate. In an embodiment, the oxidizer 10 may be hydrogen peroxide ($H_2O_2$) or may include hydrogen peroxide ($H_2O_2$). When the oxidizer 10 contains hydrogen peroxide ($H_2O_2$), hydrolysis (i.e., harsh hydrolysis) may be induced through OH/O radicals, and the polishing rate may be increased by forming a weak interface through Si—O bonding formation. The hydrolysis (i.e., harsh hydrolysis) through the OH/O radicals may be more effective than a mild hydrolysis using $H_2O/O_2/OH^-$. The oxidizer may include any one selected from the group consisting of a periodic acid, a periodate salt, a perbromic acid, a perbromate salt, a perchloric acid, a perborate salt, and a permanganate in addition to hydrogen peroxide ($H_2O_2$).

The catalyst 20 may serve to promote the hydrolysis. For example, the catalyst 20 may serve to promote generation of OH/O radicals and hydrolysis by a Fenton reaction or a reaction similar thereto. In an embodiment of the present invention, the catalyst 20 may include any one selected from the group consisting of Fe, Cu, Ce, Cr, Co, Mn, Mo, Ru, Ti, and V. Fe, Cu, Ce, Cr, Co, Mn, Mo, Ru, Ti, and V which are transition metals may perform a catalytic function in the form of ions. When the oxidizer 10 and the catalyst 20 are used together, the polishing rate (i.e., removal rate) of the boron silicon (B—Si) compound may be significantly improved compared to a case where the catalyst 20 is not used.

Further, according to an embodiment, the catalyst 20 may have a binary catalyst configuration including a first catalyst material and a second catalyst material. Here, the first catalyst material may include Fe, and the second catalyst material may include Cu. For example, the first catalyst material may be $Fe(NO_3)_3$, and the second catalyst material may be $Cu(NO_3)_2$. A concentration of the first catalyst material may be about 0.05 to about 5.0 mM or about 0.25 to about 1.0 mM, and a concentration of the second catalyst material may be about 0.05 to about 5.0 mM or about 0.25 to about 1.0 mM. When such a binary catalyst configuration is used, the polishing rate (i.e., removal rate) of the boron silicon (B—Si) compound may be greatly improved compared to when one type of catalyst material is used. Here, the binary catalyst configuration may be referred to as a 'joint catalyst (i.e., co-catalyst) configuration system' which may obtain a synergistic effect.

When the above-described binary catalyst configuration system is used, the polishing performance for the boron silicon (B—Si) compound may be adjusted according to the types and contents of the oxidizer 10 and the abrasive 30. For example, when using the above-described binary catalyst configuration system, a content of the oxidizer 10 may be about 0.5 to 5.0 wt % or about 1.5 to 2.5 wt %, and a content of the abrasive 30 may be about 0.1 to 5.0 wt % or about 2.0 to 4.0 wt %. In this case, the oxidizer 10 may include hydrogen peroxide ($H_2O_2$), and the abrasive 30 may include silica. When at least one of these conditions is satisfied, the CMP slurry composition 100 according to an embodiment may exhibit excellent polishing performance with respect to the boron silicon (B—Si) compound.

The abrasive 30 may include metal oxide particles, and may serve to mechanically polish the boron silicon (B—Si) compound. The metal oxide particles may be, for example, silica particles. However, embodiments of the present disclosure are not limited thereto, and the material of the abrasive 30 may vary according to embodiments. For example, the abrasive 30 may include any one selected from the group consisting of alumina, ceria, titania, zirconia, and germania in addition to silica.

According to an embodiment, a surface of the metal oxide (e.g., silica) particles may be modified with an amine functionalized silane (amine functionalized silane). As a specific example, the surface of the metal oxide particles may be modified with any one of APTES, DAPTMS, and TAPTMS. Here, APTES represents 3-Aminopropyl triethoxysilane, DAPTMS represents N-[3-(Trimethoxysilyl)propyl]ethylenediamine, and TAPTMS represents N-[3-(Trimethoxysilyl)propyl]diethylenetriamine. When the surface of the metal oxide particles is modified with the amine functionalized silane, as the amount of electric charge, for example, positive charge, on the modified surface increases, the dispersing force of the metal oxide particles may be increased due to the electrical repulsive force and the polishing rate and polishing efficiency may be improved. In addition, when the surface of the metal oxide particles is modified with the amine functionalized silane, the pH value at which the zeta potential becomes zero, that is, the IEP (isoelectric point) may increase, and the electrostatic attraction of the boron silicon (B—Si) compound to be polished may increase in an acidic region and a neutral region, and as a result, the polishing rate and polishing efficiency may be improved.

When the surface of the metal oxide particles is modified with amine functionalized silane, a content of amine functional silane in the abrasive 30 may be about 10 to 20 wt % or about 12 to 17 wt %.

The pH adjuster 40 may serve to adjust the pH of the CMP slurry composition 100. For example, the pH adjuster 40 may include $HNO_3$ and KOH. The pH of the CMP slurry composition 100 may be controlled between about 2.5 and about 3.5 by the pH adjuster 40. The pH of the CMP slurry composition 100 may be about 3 or have a value close to 3. When the pH of the CMP slurry composition 100 is in the range of about 2.5 to about 3.5, the catalytic reaction may be excellently activated by the catalyst 20. Thus, the polishing rate (i.e., removal rate) for the boron silicon (B—Si) compound may be improved.

The CMP slurry composition 100 according to an embodiment may include a solvent, and the solvent may be an aqueous solvent. For example, an aqueous solution containing the oxidizer 10, the catalyst 20, the abrasive 30, and the pH adjuster 40 may be prepared by using water as a solvent, and this may be used as the CMP slurry composition 100.

In the polishing process of a boron silicon(B—Si) compound, for example, a boron silicon compound film using the CMP slurry composition 100 according to an embodiment, a process pressure may be about 2.0 to 4.0 psi, a feed rate (i.e., a flow rate) of the slurry composition may be about 100 to 200 ml/min, a rotation speed of a platen may be about 60 to 100 rpm, and a rotation speed of a head may be about 60 to 100 rpm. As an example, the process pressure may be about 3.0 psi, the feed rate (i.e., flow rate) of the slurry composition may be about 150 ml/min, the rotation speed of the platen may be about 80 rpm, and the rotation speed of the head may be about 80 rpm. As a CMP pad, for example, an IC 1000 pad or the like may be used.

Figure 3:
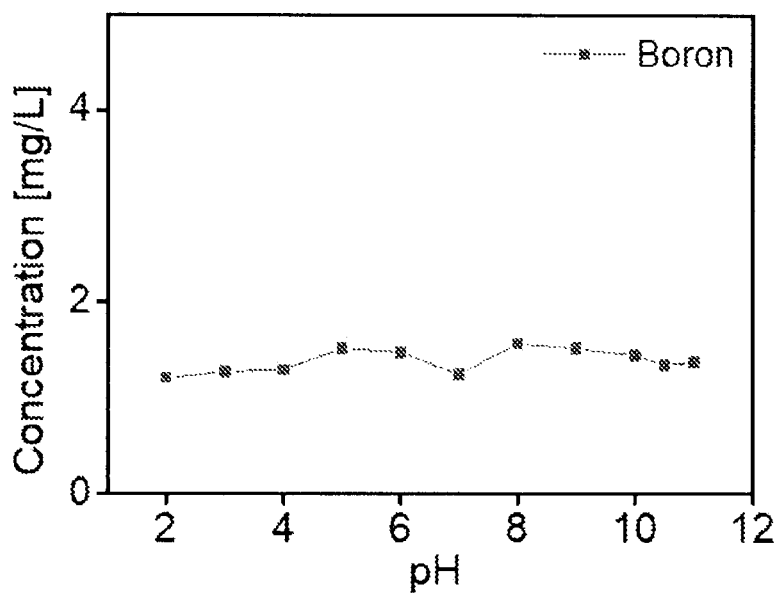
FIG. 3 is a graph illustrating a result of evaluating a dissolution behavior through a boron ICP (inductively coupled plasma spectrometer) measurement after dipping a boron silicon (B—Si) compound into solutions having different pH.

FIG. 3 is a graph illustrating a result of evaluating a dissolution behavior through a boron ICP (inductively coupled plasma spectrometer) measurement after dipping a boron silicon (B—Si) compound into solutions having different pH.

Referring to FIG. 3, in the case of the boron silicon (B—Si) compound, it may be seen that the dissolution behavior is not significantly changed according to the pH. This means that the boron silicon (B—Si) compound has excellent chemical stability. The boron silicon (B—Si) compound may have excellent chemical stability unlike conventional polysilicon (poly-Si).

Figure 4:
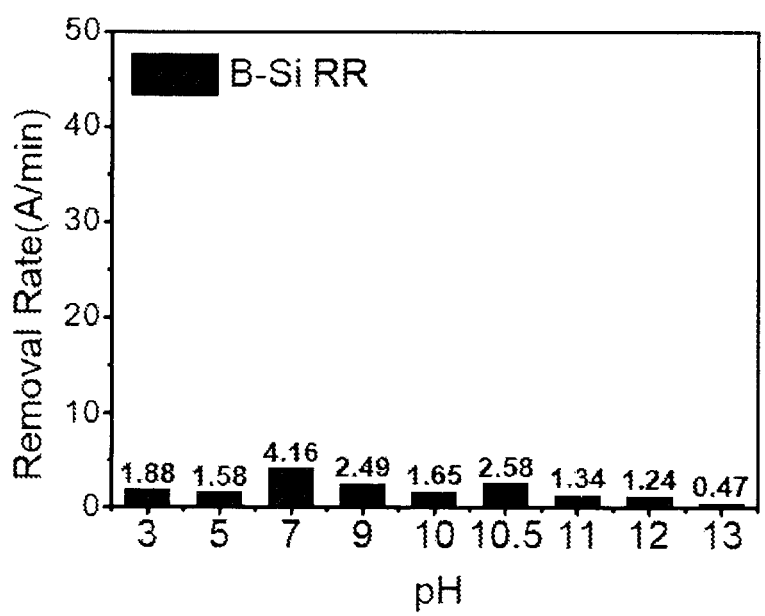
FIG. 4 is a graph illustrating a result of evaluating a removal rate of the boron silicon (B—Si) compound while changing the pH of the slurry solution without an abrasive.

FIG. 4 is a graph illustrating a result of evaluating a removal rate of the boron silicon (B—Si) compound while changing the pH of the slurry solution without an abrasive. Here, the slurry solution does not contain an abrasive (i.e., abrasive-free), and also does not contain an oxidizer and a catalyst. At this time, the process pressure was 3 psi, the platen/head speed was 80/80 rpm, the feed rate of the slurry solution was 150 ml/min, and the CMP pad was IC 1000.

Referring to FIG. 4, the removal rate was measured to be very low in the entire pH range. This means that the boron silicon (B—Si) compound is chemically stable in the entire pH range, and it is difficult to polish the boron silicon (B—Si) compound only by adjusting the pH. Therefore, in order to polish the boron silicon (B—Si) compound, a chemical reaction (chemistry) capable of inducing chemical attack or damage to the surface of the boron silicon compound may be desirable.

The following table 2 summarizes the bonding energy of atoms between Si—Si, Si—B, and B—B.

TABLE 2

| Bond | Bonding energy (kJ/mol) |
|---|---|
| Si—Si | 222 |
| Si—B | 289 |
| B—B | 293 |

Referring to Table 2, it may be seen that Si—Si bonding, Si—B bonding, and B—B bonding that may be included in the boron silicon (B—Si) compound have significantly high bonding energy.

Figure 5:
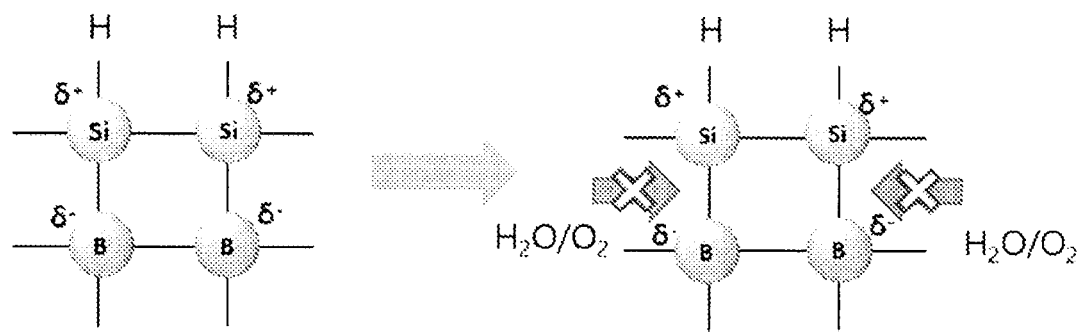
FIG. 5 is a schematic diagram for explaining chemical properties of a boron silicon (B—Si) compound which is a polishing target.

Therefore, as shown in FIG. 5, in the case of Si—B bonding and B—B bonding in the boron silicon (B—Si) compound, hydrolysis and dissolution effects by $H_2O/O_2/OH^-$ may be very small. Considering this fact, in order to effectively perform polishing on the boron silicon (B—Si) compound, it may be desirable to increase the behavior of hydrolysis and dissolution by using a bond attack through a chemical reaction (chemistry) control.

Figure 6:
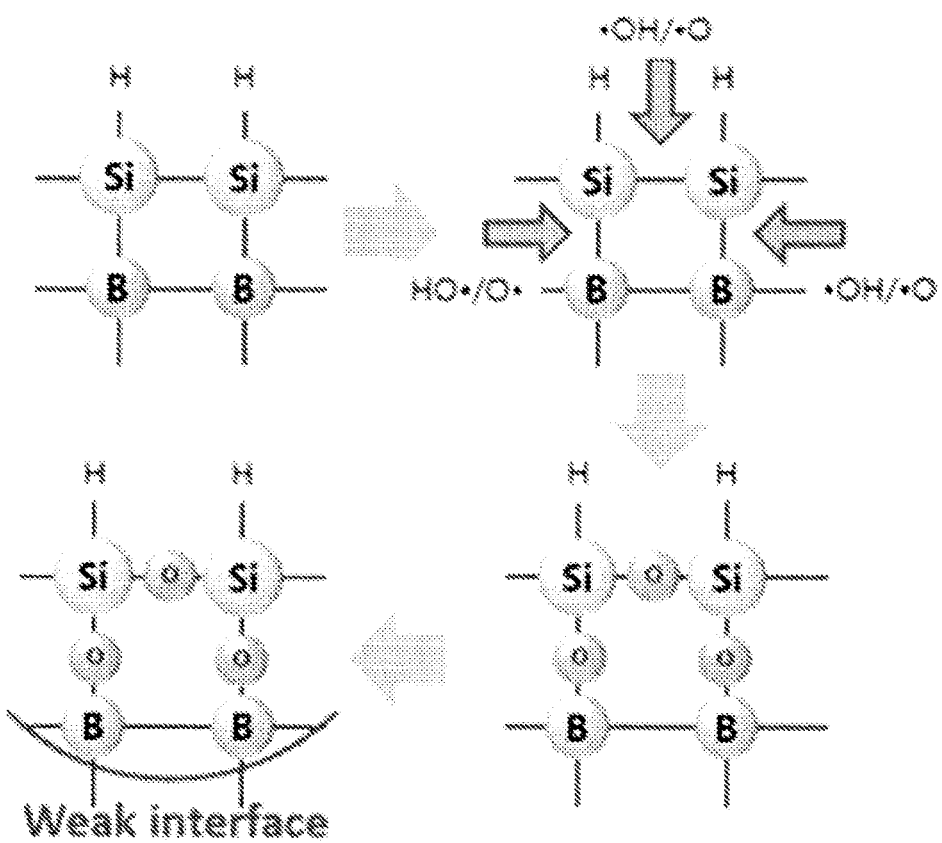
FIG. 6 is a schematic diagram illustrating a principle to improve polishing efficiency through hydrolysis by OH/O radicals with respect to a boron silicon (B—Si) compound when an oxidizer is applied to a slurry solution.

FIG. 6 is a schematic diagram illustrating a principle to improve polishing efficiency through hydrolysis by OH/O radicals with respect to a boron silicon (B—Si) compound when an oxidizer is applied to a slurry solution.

Referring to FIG. 6, when the slurry solution contains an appropriate oxidizer, a hydrolysis (e.g., a harsh hydrolysis) through OH/O radicals may be induced, and a weak interface may be formed through Si—O bonding formation. Thus, it is possible to increase the polishing rate. The hydrolysis using the OH/O radicals (i.e., a harsh hydrolysis) may be more effective than mild hydrolysis using $H_2O/O_2/OH^-$. The oxidizer may be hydrogen peroxide ($H_2O_2$) or include hydrogen peroxide ($H_2O_2$).

Figure 7:
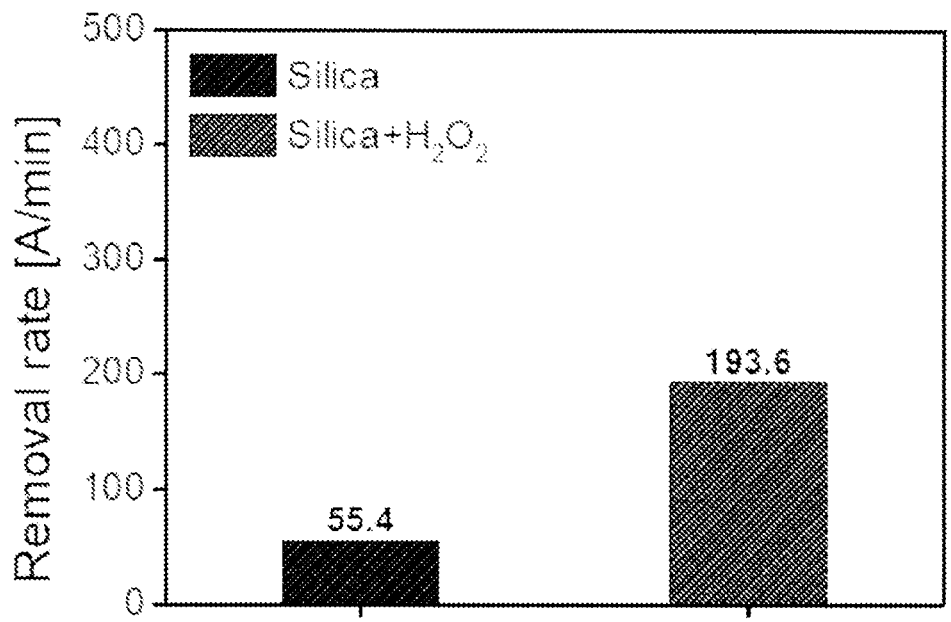
FIG. 7 is a graph illustrating a result of evaluating a removal rate of a boron silicon (B—Si) compound in a case where the slurry solution contains silica as an abrasive, but does not contain an oxidizer and a case where the slurry solution contains both of silica as an abrasive and hydrogen peroxide ($H_2O_2$) as an oxidizer.

FIG. 7 is a graph illustrating a result of evaluating a removal rate (i.e., a removal rate by CMP) of a boron silicon (B—Si) compound in a case where the slurry solution contains silica as an abrasive, but does not contain an oxidizer, and a case where the slurry solution contains both of silica as an abrasive and hydrogen peroxide ($H_2O_2$) as an oxidizer. When the slurry solution contained both of silica as an abrasive and hydrogen peroxide ($H_2O_2$) as an oxidizer, $HNO_3$ and KOH were used as pH adjusters, the pH of the slurry solution was 3.0, the process pressure was 3 psi, and platen/head speed was 80/80 rpm, the feed rate of the slurry solution was 150 ml/min, and the CMP pad was IC 1000. At this time, the content of silica was 1.0 wt %, and the content of hydrogen peroxide ($H_2O_2$) was 2.0 wt %. On the other hand, when the slurry solution includes silica as an abrasive, but does not include an oxidizer, the remaining process conditions except that the oxidizer is not included are substantially the same as the case where the slurry solution includes both silica and hydrogen peroxide ($H_2O_2$).

Referring to FIG. 7, by applying hydrogen peroxide ($H_2O_2$) as an oxidizer, hydrolysis through OH/O radicals may be induced and as a result, the removal rate (RR) of the boron silicon (B—Si) compound was increased by about 4 times compared to the case where silica was used without applying hydrogen peroxide ($H_2O_2$).

According to an embodiment, a polishing efficiency for the boron silicon (B—Si) compound may be greatly improved by the CMP slurry composition through the synergistic action of an appropriate oxidizer and an appropriate catalyst along with an abrasive and a pH adjuster.

Figure 8:
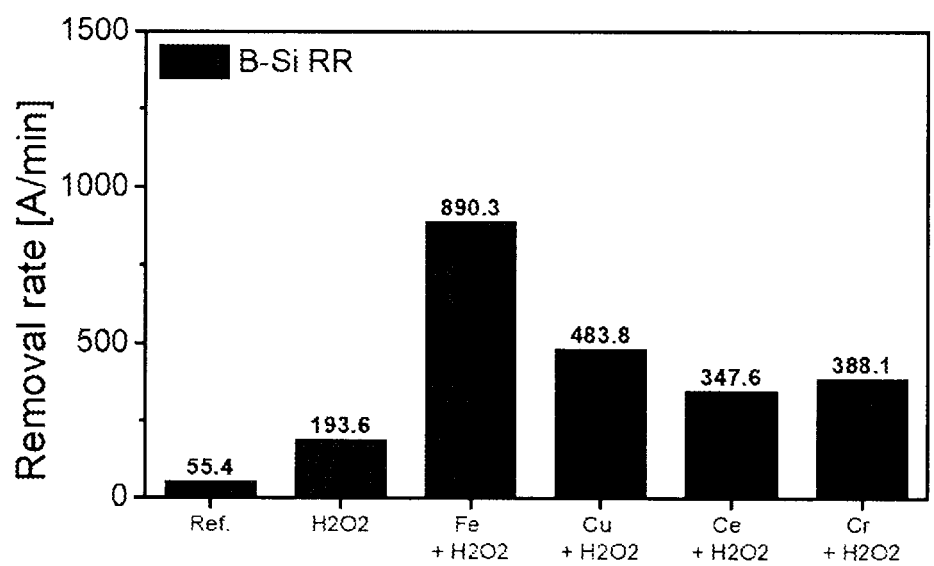
FIG. 8 is a graph illustrating a result of evaluating a removal rate of a boron silicon (B—Si) compound when the CMP slurry composition according to an embodiment of the present disclosure includes an oxidizer and a catalyst along with an abrasive and a pH adjuster.

FIG. 8 is a graph illustrating a result of evaluating a removal rate (i.e., a removal rate by CMP) of boron silicon (B—Si) compounds when the CMP slurry composition according to an embodiment includes an oxidizer and a catalyst along with an abrasive and a pH adjuster. At this time, Fe, Cu, Ce, or Cr was applied as the catalyst, and hydrogen peroxide ($H_2O_2$) was applied as the oxidizer. Here, the Fe, Cu, Ce, and Cr perform a catalytic function in the form of ions, as transition metals. For a comparison purpose, FIG. 8 includes the results for a case (represented by Ref.) that the slurry solution contains silica as an abrasive but no oxidizer and catalyst, and for a case (represented by $H_2O_2$) that the slurry solution contains silica as the abrasive and hydrogen peroxide ($H_2O_2$) as the oxidizer, but no catalyst.

When the slurry solution contained silica as an abrasive, hydrogen peroxide ($H_2O_2$) as an oxidizer, and a catalyst, $HNO_3$ and KOH were used as pH adjusters, the pH of the slurry solution was 3.0, the process pressure was 3 psi, and the platen/head speed was 80/80 rpm, the feed rate of the slurry solution was 150 ml/min, and the CMP pad was IC 1000. At this time, the content of silica was 1.0 wt %, the content of hydrogen peroxide ($H_2O_2$) was 2.0 wt %, and the concentration of the catalyst was 0.5 mM. On the other hand, when the slurry solution contains silica as an abrasive but does not contain an oxidizer and a catalyst (represented by Ref.), the remaining process conditions except that the oxidizer and catalyst are not included were substantially the same as a case where the slurry solution contains all of silica, hydrogen peroxide ($H_2O_2$), and a catalyst. In addition, when the slurry solution contains silica as an abrasive and hydrogen peroxide ($H_2O_2$) as an oxidizer but does not contain a catalyst (represented as $H_2O_2$), the remaining process conditions except that the slurry solution does not contain catalyst were substantially the same as a case where the slurry solution contains all of silica, hydrogen peroxide ($H_2O_2$), and a catalyst.

Referring to FIG. 8, when an appropriate catalyst is applied while applying hydrogen peroxide ($H_2O_2$) as an oxidizer according to this embodiment, the catalyst may serve to facilitate generation of OH/O radicals and to accelerate hydrolysis due to a Fenton reaction or a reaction similar thereto (that is, a Fenton-like reaction). Therefore, when the catalyst is applied together with hydrogen peroxide ($H_2O_2$), the removal rate (RR) of the boron silicon (B—Si) compound may be significantly improved compared to a case where hydrogen peroxide ($H_2O_2$) is added alone. In particular, when the catalyst includes Fe, the removal rate (RR) of the boron silicon (B—Si) compound is significantly improved. When the catalyst includes Fe, the material of the catalyst may be Fe(NO$_3$)$_3$.

The following formula 1 summarizes the Fenton reaction caused by Fe ions of the catalyst when the catalyst includes Fe, as an example.

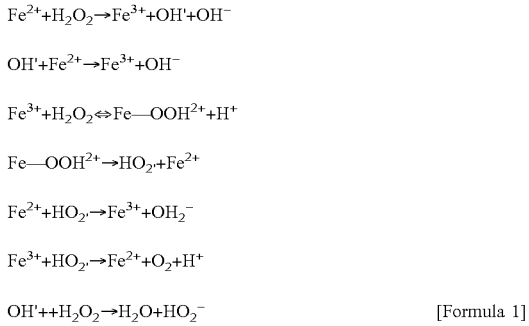

$$Fe^{2+}+H_2O_2 \rightarrow Fe^{3+}+OH^{\bullet}+OH^-$$

$$OH^{\bullet}+Fe^{2+} \rightarrow Fe^{3+}+OH^-$$

$$Fe^{3+}+H_2O_2 \Leftrightarrow Fe-OOH^{2+}+H^+$$

$$Fe-OOH^{2+} \rightarrow HO_2^{\bullet}+Fe^{2+}$$

$$Fe^{2+}+HO_2^{\bullet} \rightarrow Fe^{3+}+OH_2^-$$

$$Fe^{3+}+HO_2^{\bullet} \rightarrow Fe^{2+}+O_2+H^+$$

$$OH^{\bullet}+H_2O_2 \rightarrow H_2O+HO_2^- \quad \text{[Formula 1]}$$

Figure 9:
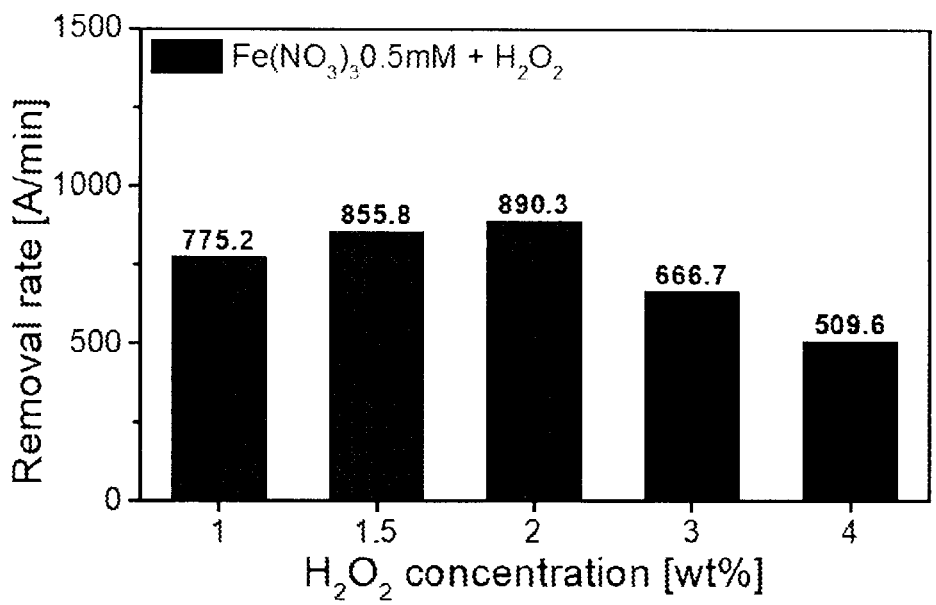
FIG. 9 is a graph illustrating a result of measuring a change in a removal rate of a boron silicon (B—Si) compound with a change of the oxidizer content (concentration) in the CMP slurry composition, according to an embodiment of the present disclosure.

FIG. 9 is a graph illustrating a result of measuring a change in a removal rate (i.e., a removal rate by CMP) of a boron silicon (B—Si) compound with a change of the oxidizer content (concentration) in the CMP slurry composition, according to an embodiment. The CMP slurry composition according to this embodiment includes an oxidizer, a catalyst, an abrasive, and a pH adjuster, and the removal rate change according to a change of the content (concentration) of the oxidizer was measured while the contents of the catalyst, the abrasive and the pH adjuster were fixed. Here, the oxidizer is hydrogen peroxide (H$_2$O$_2$), the catalyst is Fe(NO$_3$)$_3$, the abrasive is silica, and the pH adjuster is HNO$_3$ and KOH. The concentration of the catalyst was 0.5 mM, and the content of the abrasive was 1 wt %. The pH of the slurry composition was 3.0, the process pressure was 3 psi, the platen/head speed was 80/80 rpm, the slurry feed rate was 150 ml/min, and the CMP pad was IC 1000.

Referring to FIG. 9, it may be confirmed that the removal rate of the boron silicon (B—Si) compound is changed according to the content (concentration) of hydrogen peroxide (H$_2$O$_2$), which is an oxidizer. In particular, when the content (concentration) of the oxidizer (i.e., H$_2$O$_2$) is about 1.5 wt % to about 2 wt %, a relatively high removal rate may be obtained. Accordingly, in this case, the content (concentration) of the oxidizer (i.e., H$_2$O$_2$) may be preferably about 1.5 wt % to 2 wt %.

Figure 10:
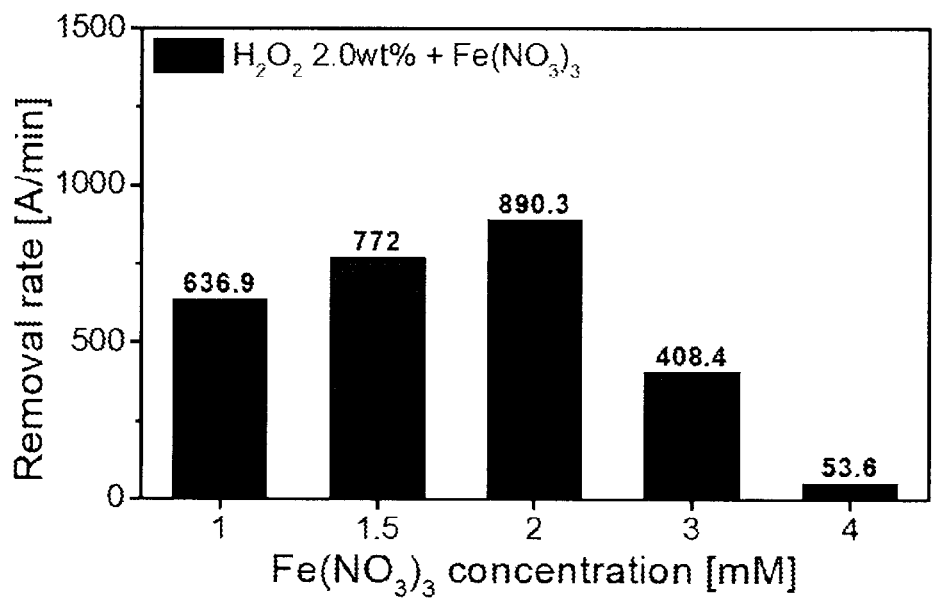
FIG. 10 is a graph illustrating a result of measuring a change in a removal rate of a boron silicon (B—Si) compound with a change in the catalyst content (concentration) in the CMP slurry composition, according to an embodiment of the present disclosure.

FIG. 10 is a graph illustrating a result of measuring a change in a removal rate (i.e., a removal rate by CMP) of a boron silicon (B—Si) compound with a change in the catalyst content (concentration) in the CMP slurry composition, according to an embodiment. The CMP slurry composition according to this embodiment includes an oxidizer, a catalyst, an abrasive, and a pH adjuster, and a change of a removal rate according to a change in the content (concentration) of the catalyst was measured while the contents of the oxidizer, the abrasive, and the pH adjuster were fixed. Here, the oxidizer was hydrogen peroxide (H$_2$O$_2$), the catalyst is Fe(NO$_3$)$_3$, the abrasive agent is silica, and the pH adjuster is HNO$_3$ and KOH. The content of the oxidizer was 2.0 wt %, and the content of the abrasive was 1 wt %. The pH of the slurry composition was 3.0, the process pressure was 3 psi, the platen/head speed was 80/80 rpm, the slurry feed rate was 150 ml/min, and the CMP pad was IC 1000.

Referring to FIG. 10, it may be confirmed that the removal rate of the boron silicon (B—Si) compound is changed according to the content (concentration) of Fe(NO$_3$)$_3$ as a catalyst. In particular, when the content of the catalyst [i.e., Fe(NO$_3$)$_3$] is about 1.5 mM to about 2 mM, a relatively high removal rate may be obtained. Therefore, in this case, the content (concentration) of the catalyst [i.e., Fe(NO$_3$)$_3$] may be preferably about 1.5 mM to about 2 mM.

Figure 11:
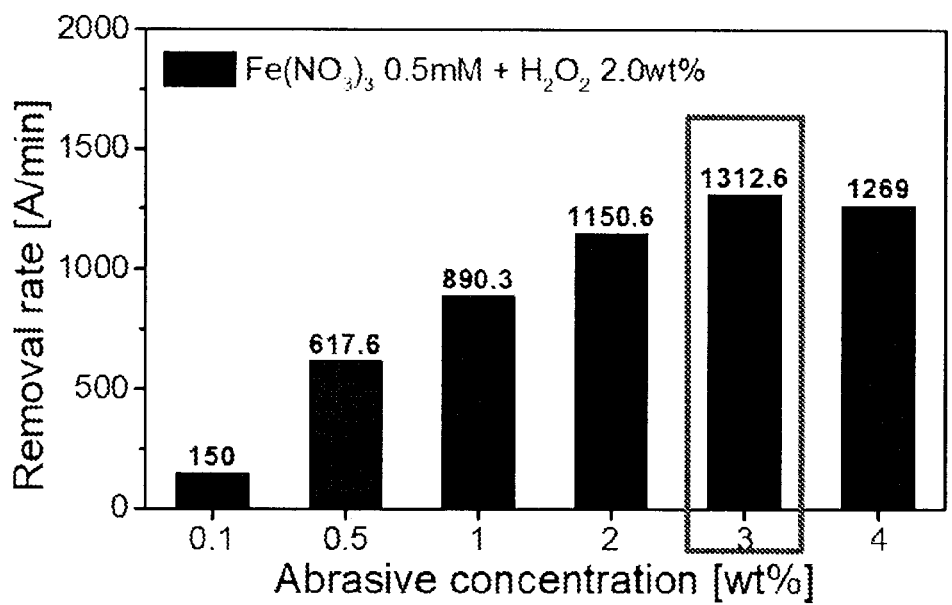
FIG. 11 is a graph illustrating a result of measuring a change in a removal rate of a boron silicon (B—Si) compound with a change of the abrasive content (concentration) in the CMP slurry composition, according to the embodiment of the present disclosure.

FIG. 11 is a graph illustrating a result of measuring a change in a removal rate (i.e., a removal rate by CMP) of a boron silicon (B—Si) compound with a change of the abrasive content (concentration) in the CMP slurry composition, according to an embodiment of the present disclosure. The CMP slurry composition according to this example includes an oxidizer, a catalyst, an abrasive, and a pH adjuster, and the removal rate change according to the change in the content (concentration) of the abrasive was measured while the contents of the oxidizer, the catalyst, and the pH adjuster were fixed. Here, the oxidizer is hydrogen peroxide (H$_2$O$_2$), the catalyst is Fe(NO$_3$)$_3$, the abrasive agent is silica, and the pH adjuster is HNO$_3$ and KOH. The concentration of the catalyst was 0.5 mM, and the content of the oxidizer was 2.0 wt %. The pH of the slurry composition was 3.0, the process pressure was 3 psi, the platen/head speed was 80/80 rpm, the slurry feed rate was 150 ml/min, and the CMP pad was IC 1000.

Referring to FIG. 11, it may be seen that the removal rate of the boron silicon (B—Si) compound is changed according to the content (concentration) of silica as an abrasive. In particular, when the content of the abrasive (silica) was about 2 wt % to about 4 wt %, a removal rate higher than 1000 Å/min could be obtained. When the content of the abrasive (silica) was 3 wt %, a high removal rate of about 1312.6 Å/min was obtained. This means that the removal rate is improved by about 24 times compared to the case using only silica in FIG. 7.

From the results of FIGS. 9 to 11, it may be seen that the polishing performance of the CMP slurry composition for the boron silicon (B—Si) compound may be improved by controlling the contents (concentrations) of the oxidizer, the catalyst, and the abrasive.

According to some embodiments, the CMP slurry composition may include an oxidizer, but embodiments of the present disclosure are not limited thereto. In other embodiments, the CMP slurry composition may not include an oxidizer. When the CMP slurry composition includes an oxidizer, for example, polishing properties may be further improved through generation of OH/O radicals. That is, when using an oxidizer, as a non-limiting example, H$_2$O$_2$, OH/O radicals may be generated through decomposition of H$_2$O/H$_2$O$_2$/O$_2$, and as a result of it, the polishing properties for the boron silicon(B—Si) compound may be further improved. When the CMP slurry composition does not include an oxidizer, the boron silicon (B—Si) compound may be polished by the action of a catalyst or the like. That is, when an oxidizer is not included and a catalyst is included, and O radicals are generated through decomposition of O$_2$ (dissolved oxygen), and accordingly, polishing properties for the boron silicon (B—Si) compound may be improved.

Figure 12:
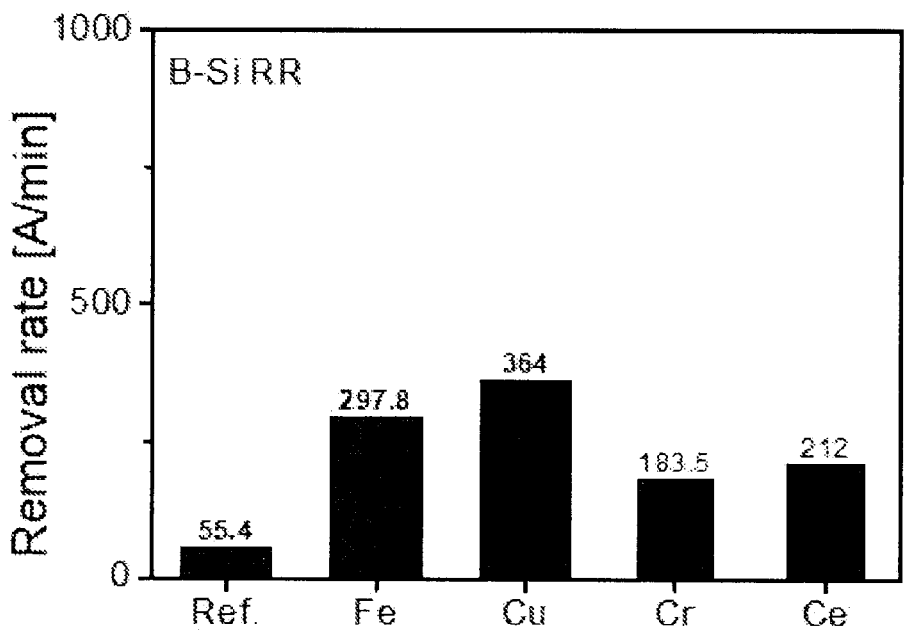
FIG. 12 is a graph illustrating a result of evaluating a change in a removal rate (i.e., a removal rate by CMP) of a boron silicon (B—Si) compound with the type of catalyst when the CMP slurry composition does not include an oxidizer but includes a catalyst.

FIG. 12 is a graph illustrating a result of evaluating a change in a removal rate (i.e., a removal rate by CMP) of a boron silicon (B—Si) compound according to the type of catalyst when the CMP slurry composition does not include an oxidizer but includes a catalyst. At this time, 1.0 wt % of silica was used as an abrasive, the pH of the slurry was 3.0 (pH adjuster: HNO$_3$/KOH), and 0.5 mM of Fe, Cu, Cr, and Ce were used as catalysts, respectively. On the other hand, Ref. shows the result of a case that no catalyst was used.

Referring to FIG. 12, when the CMP slurry composition includes a catalyst without including an oxidizer, it may be seen that the removal rate for the boron silicon (B—Si) compound increases according to the use of the catalyst.

Figure 13:
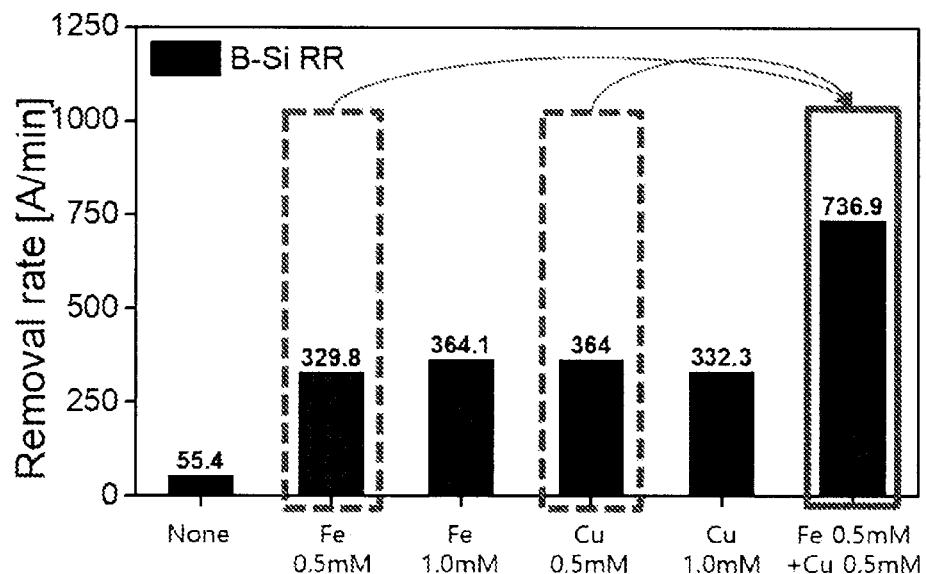
FIG. 13 is a graph illustrating a result of evaluating a change in a removal rate of a boron silicon (B—Si) compound for a case where a single catalyst material is applied in a CMP slurry composition, and for a case where a binary catalyst material is applied in a CMP slurry composition.

FIG. 13 is a graph illustrating a result of evaluating a change in a removal rate (i.e., a removal rate by CMP) of a boron silicon (B—Si) compound for a case where a single catalyst material is applied in a CMP slurry composition, and for a case where a binary catalyst material is applied in a CMP slurry composition. The CMP slurry composition includes a catalyst and an abrasive, the catalyst includes Fe or Cu, or both of Fe and Cu, and the abrasive includes silica (content of 1 wt %). For comparison, the result for the case (indicated by None) where the CMP slurry composition does not contain catalyst is also included. When the catalyst contained Fe, the catalyst material used was $Fe(NO_3)_3$ and when the catalyst contained Cu, the catalyst material used was $Cu(NO_3)_2$. When the catalyst includes both of Fe and Cu, it may be said to have a binary catalyst configuration (i.e., a co-catalyst configuration). In this case, $Fe(NO_3)_3$ was used as the first catalyst material, and $Cu(NO_3)_2$ was used as the second catalyst material. The pH of the slurry composition was 3.0, $HNO_3$ and KOH were used as pH adjusters, the process pressure was 3 psi, the platen/head speed was 80/80 rpm, the slurry feed rate was 150 ml/min, and the CMP pad was IC 1000.

Referring to FIG. 13, when the catalyst has a binary catalyst configuration including both Fe and Cu (i.e., a co-catalyst configuration), it may be seen that the removal rate of the boron silicon (B—Si) compound is greatly increased by two or more times as compared to the case where the catalyst has a single catalyst configuration including Fe or Cu. Without wishing to be bound by theory, this phenomenon may be presumed based upon the following reason that improvement effect of the electrostatic interaction between the abrasive and the film to be polished (that is, the B—Si compound), which is obtained by the increase in the positive charge of the abrasive (abrasive particles) generated due to the addition of Fe, and the Si attack effect on the film to be polished (i.e., the B—Si compound) due to the addition of Cu may cause a synergistic effect. Therefore, when the catalyst has the above-described binary catalyst configuration (i.e., a co-catalyst configuration), a polishing performance and efficiency for a boron silicon (B—Si) compound may be greatly improved.

Figure 14:
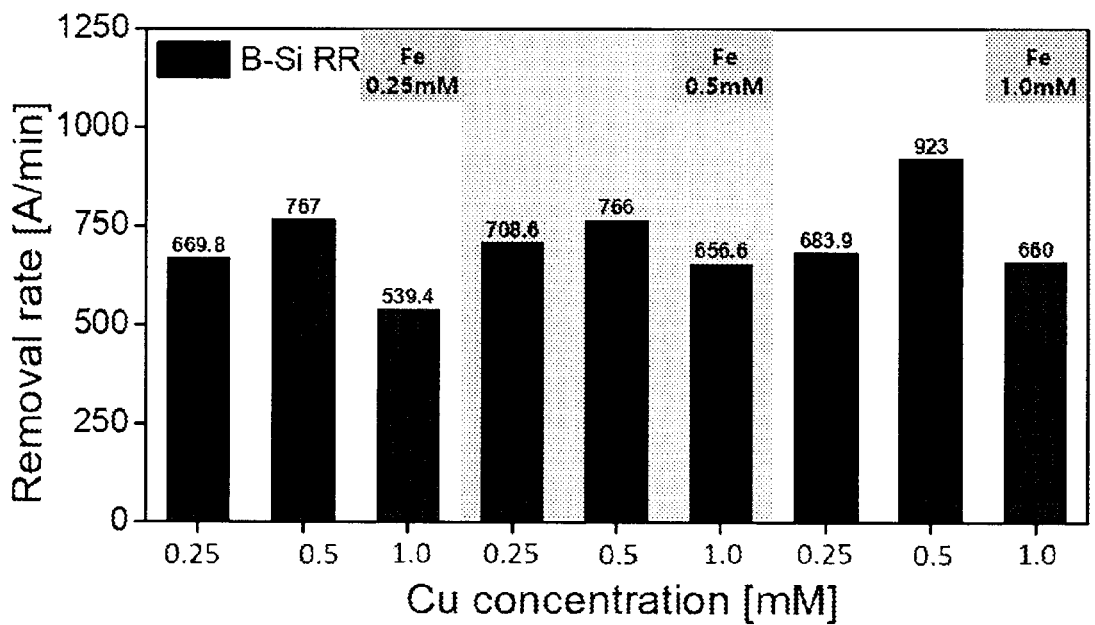
FIG. 14 a diagram illustrating a result of evaluating a change in a removal rate of a boron silicon (B—Si) compound according to a concentration change of each catalytic material when the CMP slurry composition has a binary catalyst configuration (i.e., a co-catalyst configuration).

FIG. 14 a diagram illustrating a result of evaluating a change in a removal rate (i.e., a removal rate by CMP) of a boron silicon (B—Si) compound according to a concentration change of each catalytic material when the CMP slurry composition has a binary catalyst composition (i.e., a co-catalyst composition). The CMP slurry composition includes a catalyst and an abrasive, the catalyst includes both Fe and Cu, and the abrasive includes silica (content 1 wt %). The catalyst has a binary catalyst configuration (i.e., a co-catalyst configuration) including both of Fe and Cu, wherein $Fe(NO_3)_3$ is used as the first catalyst material and $Cu(NO_3)_2$ is used as the second catalyst material. The concentration of the first catalyst material [i.e., $Fe(NO_3)_3$] was controlled in the range of 0.25 to 1.0 mM, and the concentration of the second catalyst material [i.e., $Cu(NO_3)_2$] was also controlled in the range of 0.25 to 1.0 mM. The pH of the slurry composition was 3.0, $HNO_3$ and KOH were used as pH adjusters, the process pressure was 3 psi, the platen/head speed was 80/80 rpm, the slurry feed rate was 150 ml/min, and the CMP pad was IC 1000.

Referring to FIG. 14, in a case where the CMP slurry composition has a binary catalyst configuration (i.e., a co-catalyst configuration), when the concentration of the first catalyst material [i.e., $Fe(NO_3)_3$] is about 0.25 to 1.0 mM, and the concentration of the second catalyst material [i.e., $Cu(NO_3)_2$] is about 0.25 to 1.0 mM, it may be confirmed that a remarkably high removal rate may be secured.

Figure 15:
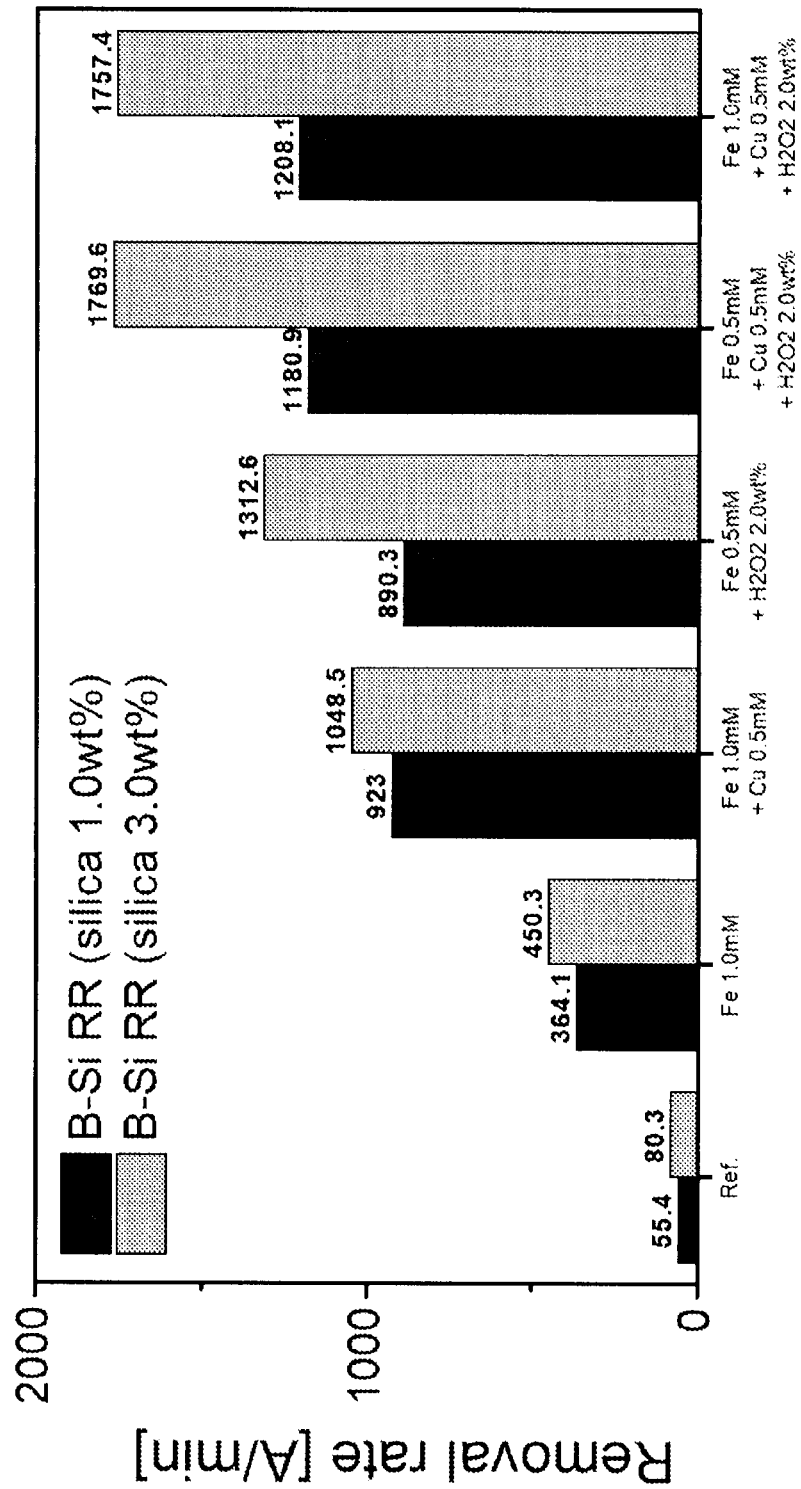
FIG. 15 is a graph illustrating a result of evaluating a change in the removal rate of a boron silicon (B—Si) compound according to a change of a content of the abrasive in the CMP slurry composition, a change in the catalyst composition, and whether or not an oxidizer is added.

FIG. 15 is a graph illustrating a result of evaluating a change in the removal rate (i.e., a removal rate by CMP) of a boron silicon (B—Si) compound according to a change of a content of the abrasive in the CMP slurry composition, a change in the catalyst composition, and whether or not an oxidizer is added. Silica was used as an abrasive, and the content was 1.0 wt % or 3.0 wt %. The catalyst was applied to a case containing only Fe and a case containing both of Fe and Cu. When the catalyst contained Fe, the used catalyst material was $Fe(NO_3)_3$, and when the catalyst contained Cu, the used catalyst material was $Cu(NO_3)_2$. When the catalyst includes both Fe and Cu, it may be said to have a binary catalyst configuration (i.e., a co-catalyst configuration). At this time, $Fe(NO_3)_3$ was used as the first catalyst material, and $Cu(NO_3)_2$ was used as the second catalyst material. Hydrogen peroxide ($H_2O_2$) was used as an oxidizer. For comparison, the results for a case (represented as Ref.) that oxidizer and catalyst are not applied, and a case (represented as Fe 1.0 mM) where oxidizer is not applied are also included. The pH of the slurry composition was 3.0, $HNO_3$ and KOH were used as pH adjusters, the process pressure was 3 psi, the platen/head speed was 80/80 rpm, the slurry feed rate was 150 ml/min, and the CMP pad was IC 1000.

Referring to FIG. 15, when the catalyst has the above binary catalyst configuration (i.e., a co-catalyst configuration), and an oxidizer (i.e., $H_2O_2$) is applied thereto, and an appropriate amount of an abrasive is applied, it may be confirmed that a very high removal rate characteristic of 1700 Å/min or more may be secured. This shows an improvement in the removal rate of about 32 times as compared to the case of using only silica in FIG. 7. Excellent polishing performance and efficiency may be obtained by the effect according to the binary catalyst configuration (i.e., a co-catalyst configuration), the promotion of OH/O radical generation by the Fenton reaction, and the effect according to the appropriate abrasive content.

In the binary catalyst configuration (i.e., co-catalyst configuration), the first catalyst material may be $Fe(NO_3)_3$ and the second catalyst material may be $Cu(NO_3)_2$, wherein the concentration of the first catalyst material may be about 0.05 to 5.0 mM or about 0.25 to 1.0 mM, and the concentration of the second catalyst material may be about 0.05 to 5.0 mM or about 0.25 to 1.0 mM. The content of the oxidizer may be about 0.5 to about 5.0 wt % or about 1.5 to about 2.5 wt %, and the content of the abrasive may be about 0.1 to about 5.0 wt % or about 2.0 to about 4.0 wt %. The oxidizer may include hydrogen peroxide ($H_2O_2$), and the abrasive may include silica. When at least one of these conditions is satisfied, excellent polishing performance as described with reference to FIG. 15 may be secured.

In the CMP slurry composition according to an embodiment, the abrasive may include metal oxide particles. The metal oxide particles may be nanoparticles having a nanoscale. The metal oxide particles may be, for example, silica particles. According to one embodiment, the surface of the metal oxide, for example, silica particles may be modified with an amine functionalized silane. As a specific example, the surfaces of the metal oxide particles may be modified with any one of APTES, DAPTMS, and TAPTMS. Here, APTES represents 3-Aminopropyl triethoxysilane, DAPTMS represents N-[3-(Trimethoxysilyl)propyl]ethylenediamine, and TAPTMS represents N-[3-(Trimethoxysilyl)propyl]diethylenetriamine. When the surfaces of the metal oxide particles are modified with the amine functionalized silane, as the amount of electric charge, for example, positive charge on the modified surfaces increases, the dispersing force between the metal oxide particles is increased due to the electrical repulsive force, and the polishing rate and polishing efficiency may be improved. In addition, when the surfaces of the metal oxide particles are modified with the amine functionalized silane, the pH value at which the zeta potential becomes zero, that is, the IEP (isoelectric point) may increase, and the electrostatic attraction of the boron silicon (B—Si) compound to be polished may increase in the acidic and neutral regions, and as a result, the polishing rate and polishing efficiency may be improved.

Figure 16:
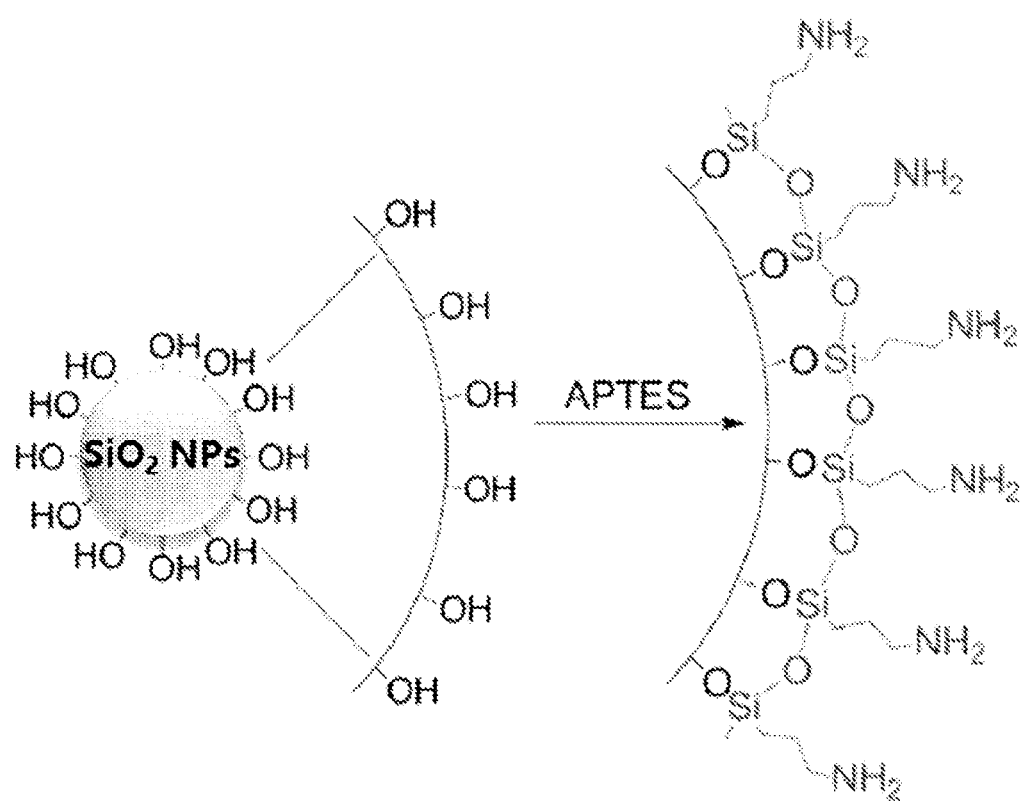
FIG. 16 is a diagram illustrating a process for modifying a surface of one of silica particles (nano particles) corresponding to an abrasive with APTES.

FIG. 16 is a diagram illustrating a process for modifying a surface of one of silica particles (nano particles) corresponding to an abrasive with APTES. The silica particles whose surfaces have been modified with APTES may be referred to as an organo-silane modified silica.

Figure 17:
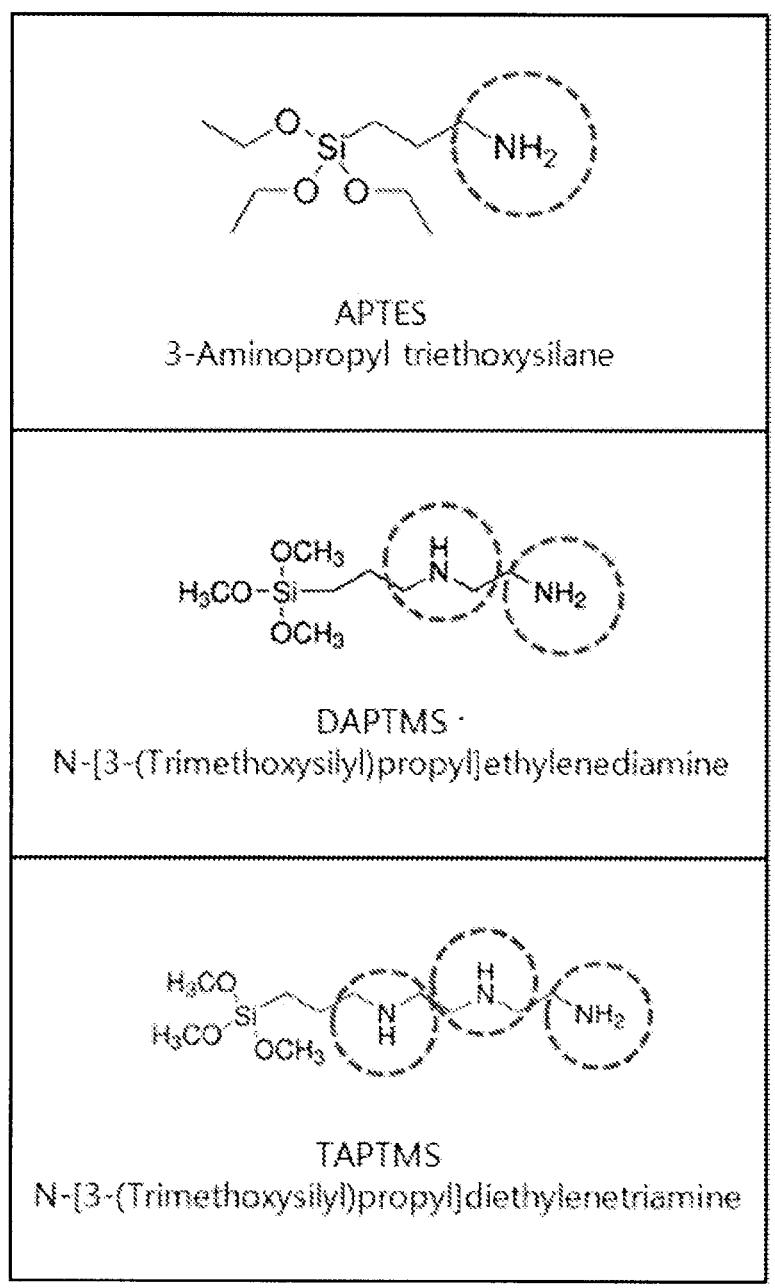
FIG. 17 is a diagram illustrating chemical structures of APTES, DAPTMS, and TAPTMS which may be used for surface modification of an abrasive.

FIG. 17 is a diagram illustrating chemical structures of APTES, DAPTMS, and TAPTMS which may be used for surface modification of an abrasive.

Figure 18:
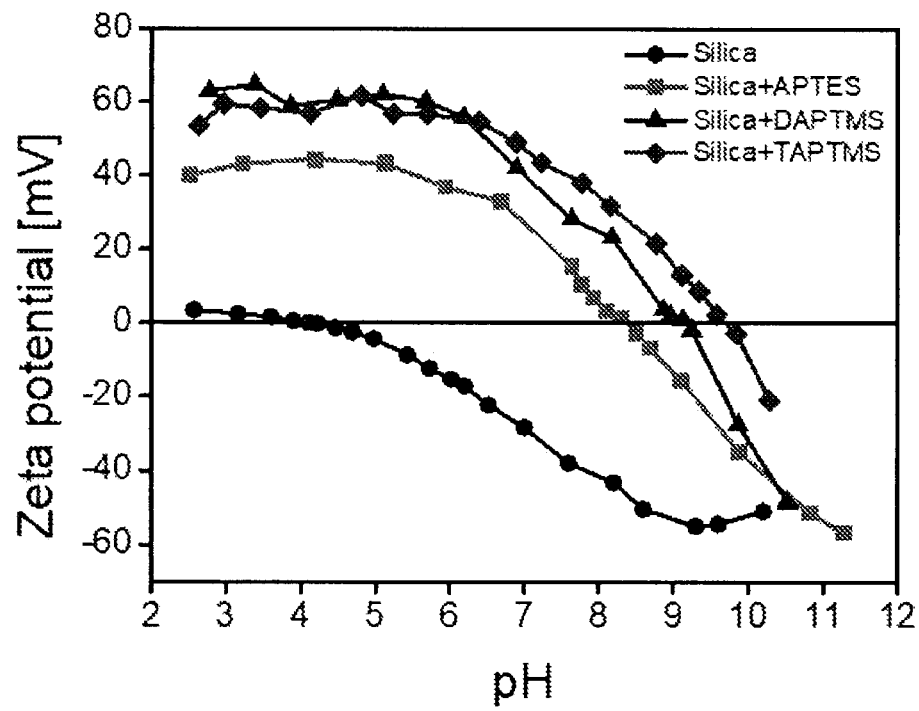
FIG. 18 is a graph illustrating changes in zeta potential when the surfaces of silica particles (nanoparticles) corresponding to an abrasive are modified with APTES, DAPTMS or TAPTMS.

FIG. 18 is a graph illustrating changes in zeta potential when the surfaces of silica particles (nanoparticles) corresponding to an abrasive are modified with APTES, DAPTMS or TAPTMS. At this time, the content of amine functional silane in the abrasive was about 14.5 wt %.

Referring to FIG. 18, as the surfaces of the silica particles (nano particles) corresponding to the abrasive are modified with APTES, DAPTMS or TAPTMS, it may be seen that the IEP (isoelectric point), that is, the pH value at which the zeta potential becomes zero is increased to about 8.3-9.8. When the surfaces of silica particles are modified with an amine functionalized silane such as APTES, DAPTMS, and TAPTMS, as the amount of electric charge (e.g., positive charge) on the modified surfaces increases, the dispersing force between the particles due to electrical repulsion may increase, and the polishing rate and polishing efficiency may be improved. In addition, when the surface of the silica particles is modified with the amine functionalized silane, the IEP may increase, and the electrostatic attraction of the boron silicon (B—Si) compound to be polished in the acidic and neutral regions may increase. As a result, the polishing rate and polishing efficiency may be improved.

Figure 19:
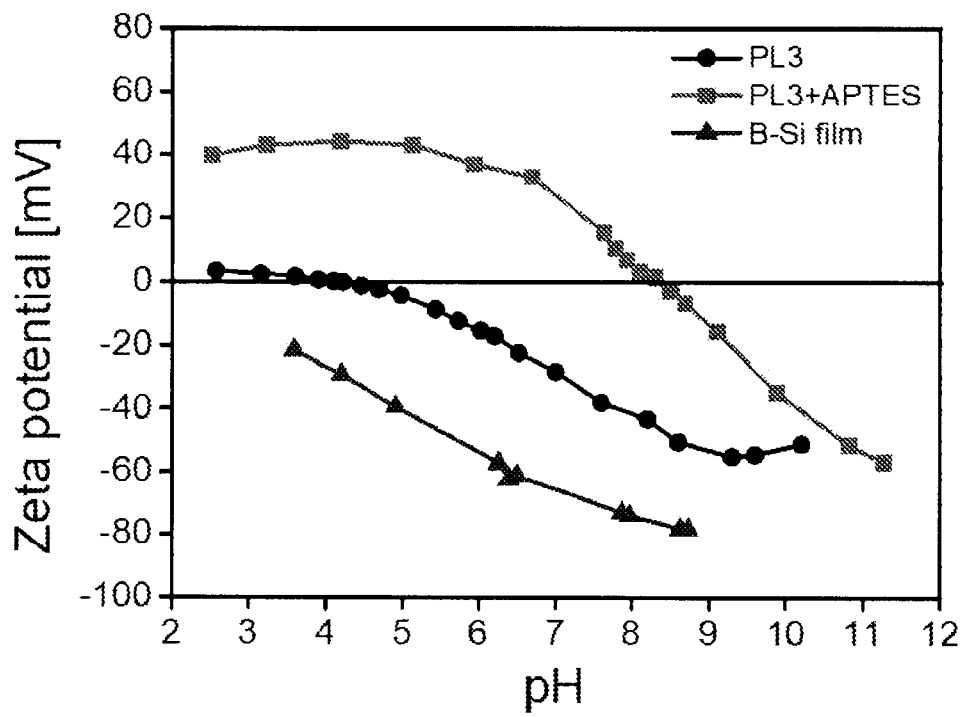
FIG. 19 is a graph illustrating changes in zeta potential according to pH changes of each of a boron silicon (B—Si) compound which is a polishing target, silica which is an abrasive, and silica surface-modified with APTES.

FIG. 19 is a graph illustrating changes in zeta potential according to pH changes of each of a boron silicon (B—Si) compound which is a polishing target, silica which is an abrasive, and silica surface-modified with APTES. Here, PL3 denotes silica whose surface was not modified, PL3+APTES denotes silica surface-modified with APTES, and B—Si film denotes a boron silicon (B—Si) compound.

Referring to FIG. 19, as the surface of silica is modified with APTES, an electrostatic attraction between the B—Si film and an abrasive, for example, silica in an acidic and neutral region may increase due to a change in zeta potential, and as a result, the polishing rate and polishing efficiency may be improved.

Figure 20:
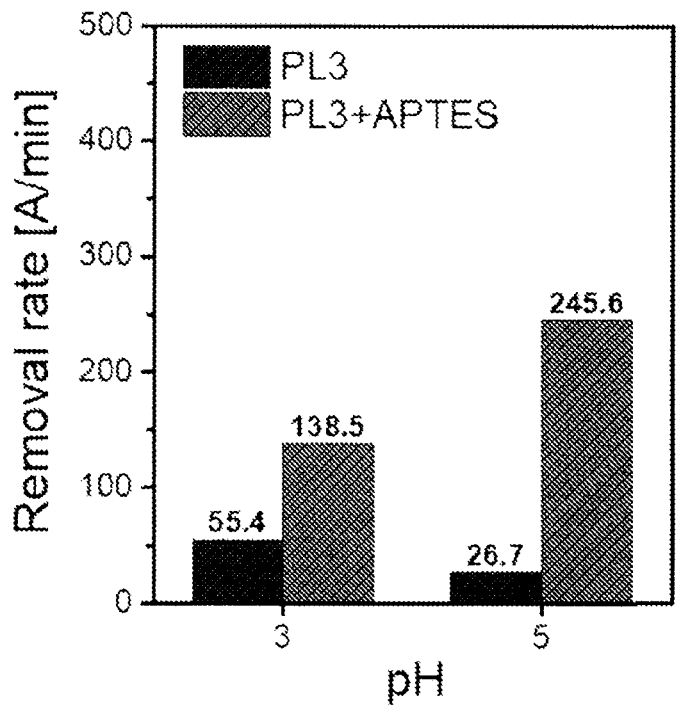
FIG. 20 is a graph illustrating a result of evaluating the removal rate characteristics of a boron silicon (B—Si) compound during the CMP process to which the silica (PL3) and the surface-modified silica (PL3+APTES) of FIG. 19 are applied.

FIG. 20 is a graph illustrating a result of evaluating the removal rate characteristics of a boron silicon (B—Si) compound during the CMP process to which the silica (PL3) and the surface-modified silica (PL3+APTES) of FIG. 19 are applied. At this time, the silica content was about 1.0 wt %, HNO₃ and KOH were used as pH adjusters, the process pressure was 3 psi, the platen/head speed was 80/80 rpm, and the slurry feed rate was 150 ml/min, and the CMP pad was IC 1000.

Referring to FIG. 20, it may be seen that relatively superior polishing performance is obtained when the surface-modified silica (PL3+APTES) is used as compared to a case where the non-surface-modified silica (PL3) is used.

The CMP slurry composition according to the above-described embodiments of the present disclosure may be applied for polishing a boron silicon (B—Si) compound. The CMP method for a boron silicon (B—Si) compound according to embodiments may include providing a substrate structure including a thin film formed of a boron silicon (B—Si) compound and performing a CMP process on the thin film, wherein the CMP process may be performed by using the CMP slurry composition according to the above-described embodiments.

In particular, the CMP method using the CMP slurry composition according to embodiments may be usefully applied for the purpose of polishing (removing) a B—Si compound in the case of applying the boron silicon (B—Si) compound as a hard mask material when forming a storage node of a DRAM. The following FIG. 21A to FIG. 21F show a method of manufacturing a semiconductor device including the above-described storage node formation, according to an embodiment.

FIG. 21A to FIG. 21F are cross-sectional diagrams illustrating a method of manufacturing a semiconductor device to which a CMP method using a CMP slurry composition for polishing a boron silicon (B—Si) compound according to an embodiment of the present invention is applied.

Figure 21A:
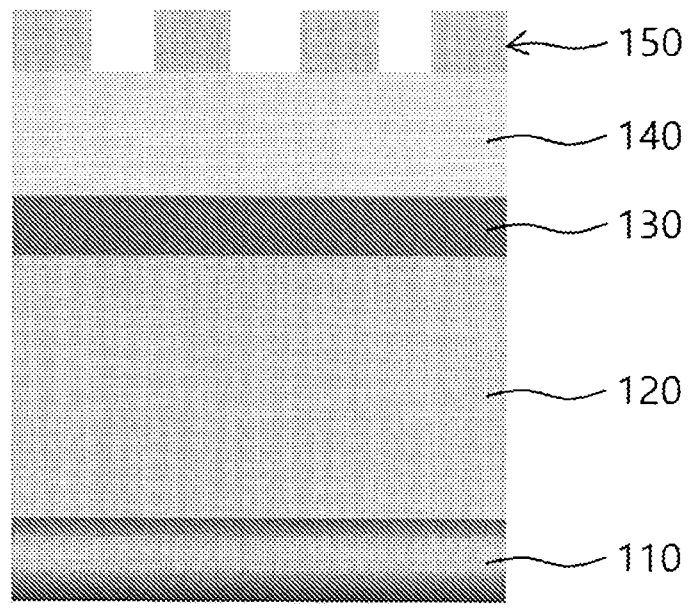
FIG. 21A, 21B, 21C, 21D, 21E, and FIG. 21F are cross-sectional diagrams illustrating a method of manufacturing a semiconductor device to which a CMP method using a CMP slurry composition for polishing a boron silicon (B—Si) compound according to an embodiment of the present disclosure is applied.

Referring to FIG. 21A, a mold layer 120 may be formed on an underlying layer 110. The underlying layer 110 may include a predetermined substrate (a semiconductor substrate), a plurality of transistors formed on the substrate, and wirings or vias connected thereto. The mold layer 120 is an etching target layer and may be formed of a predetermined insulating material, for example, silicon oxide or the like.

An insulating material layer 130 may optionally be further formed on the mold layer 120. The insulating material layer 130 may be formed of a material (an insulating material) different from that of the mold layer 120. For example, the insulating material layer 130 may be formed by a silicon nitride. The mold layer 120 may be referred to as a first insulating layer, and in this case, the insulating material layer 130 may be referred to as a second insulating layer. The mold layer 120 and the insulating material layer 130 may be collectively referred to as one 'mold layer'. In some cases, the insulating material layer 130 may not be formed.

Next, a hard mask layer 140 may be formed on the insulating material layer 130. The hard mask layer 140 may include a boron silicon (B—Si) compound. The content of boron in the boron silicon (B—Si) compound may be about 55 to about 75 mole % or about 60 to about 70 mole %. The boron silicon (B—Si) compound may be a material in which a boron atom and a silicon atom are chemically bonded. The boron silicon (B—Si) compound may be referred to as a kind of "boron silicon (B—Si) alloy." Both of boron and silicon are metalloids, and it may be said that an alloy are formed by chemical bonding between them. In addition, the boron silicon (B—Si) compound may be said to be a kind of boron silicide.

The hard mask layer 140 may be formed to a thickness of, for example, about 200 to 1000 nm. If the hard mask layer 140 is too thick, there is a possibility that the process for forming a hard mask pattern 140a by etching the hard mask layer 140 in the step of FIG. 21B may not be easy, and the hard mask pattern 140a may collapse. Conversely, if the hard mask layer 140 is too thin, it may be difficult for the hard mask pattern 140a to properly function as an etching mask in the step of FIG. 21C.

Next, a photoresist layer pattern 150 may be formed on the hard mask layer 140. The photoresist layer pattern 150 may be formed of a general photoresist material.

Figure 21B:
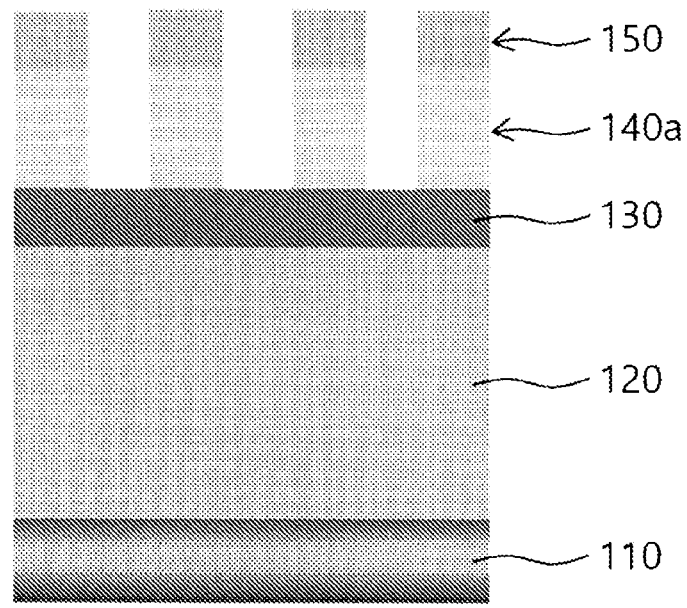

Referring to FIG. 21B, the hard mask layer 140 may be patterned by using the photoresist layer pattern 150 as an etch mask to form a hard mask pattern 140a therefrom.

Figure 21C:
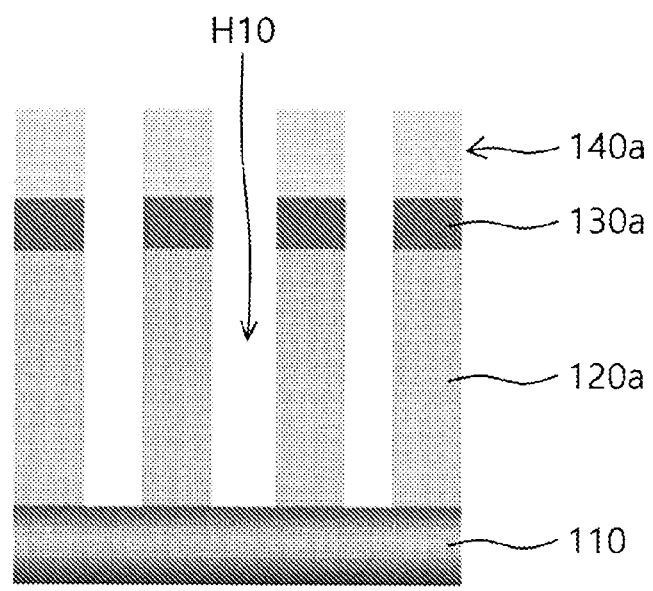

Referring to FIG. 21C, a plurality of holes H10 exposing the underlying layer 110 may be formed by etching the insulating material layer 130 and the mold layer 120 by using the hard mask pattern 140a as an etching mask. Such an etching process may be performed as a dry etching process. In addition, during the etching process, the photoresist layer pattern (150 of FIG. 21B) may be removed. The mold layer 120 and the insulating material layer 130 in which the plurality of holes H10 are formed by etching are denoted by reference numerals 120a and 130a, respectively. The etched mold layer 120 in which the plurality of holes H10 are formed may be referred to as a mold layer pattern 120a, and the etched insulating material layer 130 in which the plurality of holes H10 are formed may be referred to as an insulating layer pattern 130a.

Since the hard mask pattern 140a has superior properties as compared to the existing poly-Si, the hard mask pattern 140a may not be significantly lost while forming the plurality of holes H10, and may generally maintain its shape well. Even if an aspect ratio of the hole H10 is large, a thickness and a shape of the hard mask pattern 140a may be generally well maintained.

Figure 21D:
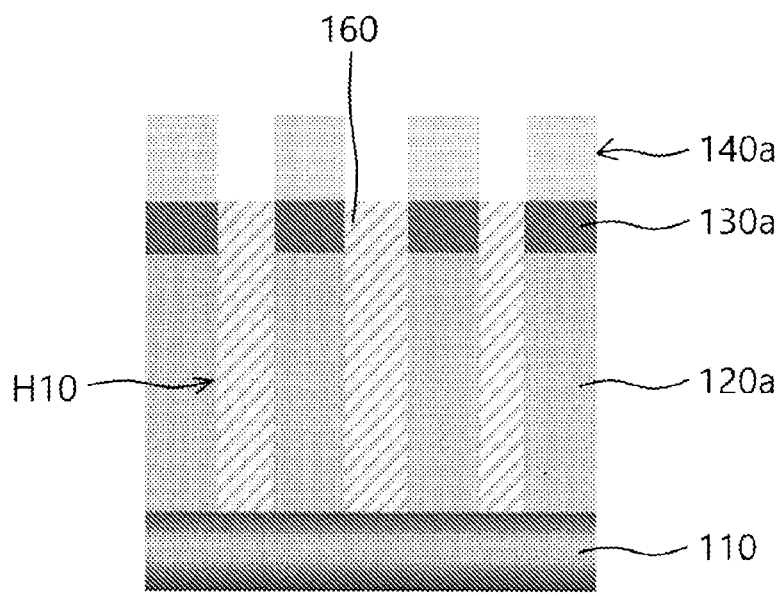

Referring to FIG. 21D, a storage node 160 may be formed in the plurality of holes H10 through a thin film formation process such as an atomic layer deposition process. The storage node 160 may be formed of, for example, a conductive material such as TiN, but is not limited thereto, and the material of the storage node 160 may vary according to embodiments. The storage node 160 may be formed so that it may be electrically connected to a circuit configuration such as a transistor through a via or a wiring of the underlying layer 110.

Figure 21E:
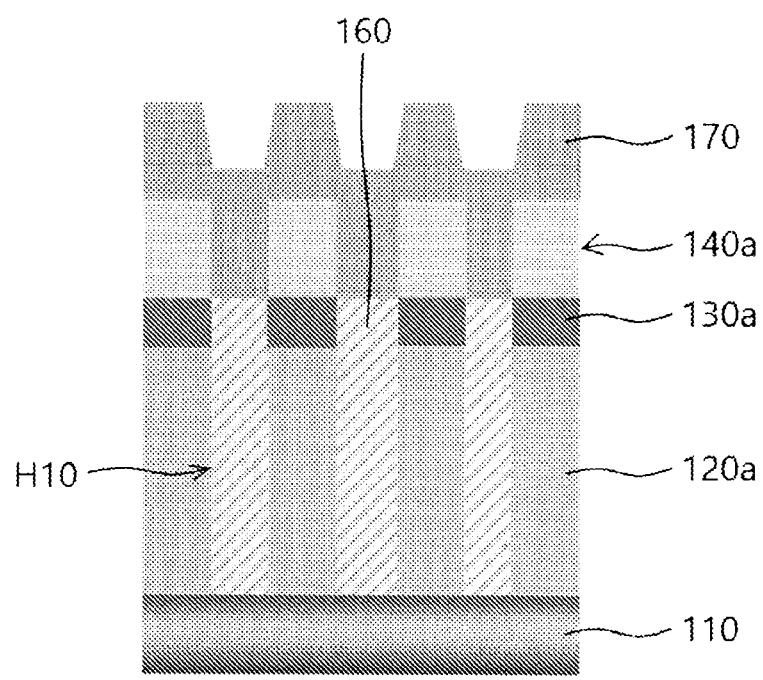

Referring to FIG. 21E, a gap-fill material layer 170 covering the hard mask pattern 140a and the storage node 160 exposed thereunder may be formed. The opening regions of the hard mask pattern 140a may be filled by the gap-fill material layer 170. The gap-fill material layer 170 may be formed by a predetermined insulating material. In some cases, the gap-fill material layer 170 may not be formed.

Figure 21F:
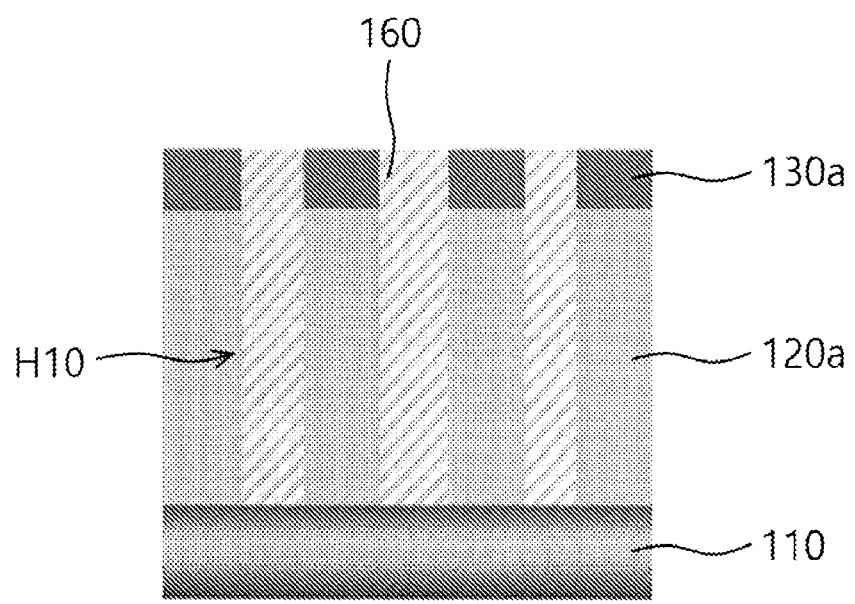

Subsequently, a step for removing the hard mask pattern 140a by a CMP process may be performed. The step for removing the hard mask pattern 140a by the CMP process may be performed by using the boron silicon (B—Si) compound polishing CMP slurry composition according to the above-described embodiments. As a result, a device structure as shown in FIG. 21F may be obtained. When the CMP slurry composition for polishing a boron silicon (B—Si) compound according to embodiments of the present disclosure is used, the CMP process for the hard mask pattern 140a may be easily performed.

Although not shown, after a part of the insulating material layer 130a is removed, an etching solution is injected through a part of the mold layer 120a exposed by removing the part of the insulating material layer 130a, so that the entire mold layer 120a may be removed by a wet etching method. Here, the portions of the insulating material layer 130a that are not removed and remain may serve to support the storage node 160. Then, a capacitor including the storage node 160 may be formed, and the DRAM device may be manufactured through a subsequent process. The subsequent process may be performed according to a general DRAM process.

According to the embodiments of the present disclosure described in the above paragraphs, it is possible to implement a CMP slurry composition for polishing a boron silicon (B—Si) compound capable of chemically and mechanically polishing a boron silicon (B—Si) compound thin film with ease. If the CMP slurry composition for polishing the boron silicon (B—Si) compound is used, the boron silicon (B—Si) compound may be easily polished (removed) according to the CMP method in the manufacturing process of an electronic device (e.g., a semiconductor device) such as formation of a storage node of DRAM. Accordingly, it is possible to easily manufacture a high-integration/high-performance semiconductor device to which a boron silicon (B—Si) compound is applied.

In the present specification, preferred embodiments have been disclosed, and although specific terms are used, these are only used in a general sense to easily describe the technical content of the present disclosure and to help the understanding of various embodiments of the present disclosure, and are not used to limit the scope of embodiments of the present disclosure. Other modifications may be implemented in addition to the embodiments disclosed herein. Those having common knowledge in the related art will understand that various substitutions, changes and modifications may be made without departing from the technological concepts of the present disclosure in connection with the CMP slurry composition for polishing boron silicon compound, the CMP method using the same and the method of manufacturing a semiconductor device using the same according to the embodiments described with reference to FIGS. 1 to 21F. Therefore, the scope of the invention should not be limited to the described embodiments, but should be determined by the technological concepts described in the claims.

EXPLANATION OF SYMBOLS

*Explanation of Symbols for the Main Parts of the Drawing*

| 10: oxidizer | 20: catalyst |
|---|---|
| 30: abrasive | 40: pH adjuster |
| 100: CMP slurry composition | 110: underlying layer |
| 120: mold layer | 130: insulating material layer |
| 120a: mold layer pattern | 130a: insulating layer pattern |
| 140: hard mask layer | 140a: hard mask pattern |
| 150: photoresist pattern | 160: storage node |
| 170: gap-fill material layer | H10: hole |

What is claimed is:

1. A CMP (chemical mechanical polishing) slurry composition for polishing a boron silicon (B—Si) compound, the CMP slurry composition comprising:
    a catalyst having a binary catalyst configuration that comprises a first catalyst material and a second catalyst material;
    an abrasive including a plurality of particles and being configured to polish the boron silicon (B—Si) compound; and
    a pH adjuster,
    wherein the first catalyst material includes Fe, and the second catalyst material includes Cu.

2. The CMP slurry composition of claim 1, further comprising an oxidizer, and wherein the oxidizer includes any one selected from the group consisting of hydrogen peroxide ($H_2O_2$), periodic acid, periodate salt, perbromic acid, perbromate salt, perchloric acid, perborate salt, and permanganate.

3. The CMP slurry composition of claim 2, wherein a content of the oxidizer is about 1.5 wt % to about 2 wt %.

4. The CMP slurry composition of claim 1, wherein the first catalyst material is $Fe(NO_3)_3$ and the second catalyst material is $Cu(NO_3)_2$.

5. The CMP slurry composition of claim 1, wherein a concentration of the first catalyst material is about 0.05 to about 5.0 mM, and a concentration of the second catalyst material is about 0.05 to about 5.0 mM.

6. The CMP slurry composition of claim 1, wherein the abrasive includes metal oxide particles, and surfaces of the metal oxide particles are modified with amine functionalized silane.

7. The CMP slurry composition of claim 6, wherein the surfaces of the metal oxide particles are modified with any one of APTES, DAPTMS, and TAPTMS.

8. The CMP slurry composition of claim 6, wherein the metal oxide particles are silica particles.

9. The CMP slurry composition of claim 1, wherein the CMP slurry composition has a pH of about 2.5 to about 3.5.

10. The CMP slurry composition of claim 1, wherein a content of boron in the boron silicon (B—Si) compound is about 55 to about 75 mole %.

11. The CMP slurry composition of claim 1, wherein a content of the catalyst is about 1.5 mM to about 2 mM.

12. The CMP slurry composition of claim 1, wherein a content of the abrasive is about 2 wt % to about 4 wt %.

13. A CMP (chemical mechanical polishing) method for a boron silicon (B—Si) compound, comprising:
    providing a substrate structure including a thin film formed of the boron silicon (B—Si) compound; and
    performing a CMP process on the thin film,
    wherein the CMP process is performed by using the CMP slurry composition of claim 1.

14. A method of manufacturing a semiconductor device, comprising:
    forming a mold layer on an underlying layer;
    forming a hard mask layer including a boron silicon (B—Si) compound on the mold layer;
    forming a photoresist pattern on the hard mask layer;
    forming a hard mask pattern by patterning the hard mask layer using the photoresist pattern as an etch mask;
    forming a plurality of holes that exposes the underlying layer by etching the mold layer using the hard mask pattern as an etch mask;
    forming a storage node in the plurality of holes; and
    removing the hard mask pattern by a CMP process,
    wherein removing the hard mask pattern by the CMP process is performed using the CMP slurry composition of claim 1.

15. A CMP (chemical mechanical polishing) slurry composition for polishing a boron silicon (B—Si) compound, the CMP slurry composition comprising:
    a catalyst;
    an abrasive including a plurality of particles and being configured to polish the boron silicon (B—Si) compound;
    a pH adjuster; and
    an oxidizer, and
    wherein a content of the oxidizer is about 0.5 to about 5.0 wt %, and a content of the abrasive is about 0.1 to about 5.0 wt %,
    wherein the catalyst has a binary catalyst configuration comprising a first catalyst material and a second catalyst material, and
    wherein the first catalyst material includes Fe, and the second catalyst material includes Cu.

* * * * *